United States Patent [19]
Shimahara et al.

[11] Patent Number: 6,139,642
[45] Date of Patent: Oct. 31, 2000

[54] SUBSTRATE PROCESSING APPARATUS AND METHOD

[75] Inventors: Takashi Shimahara; Naoto Nakamura; Ichiro Sakamoto; Kiyohiko Maeda, all of Tokyo, Japan

[73] Assignee: Kokusai Electric Co., Ltd., Tokyo, Japan

[21] Appl. No.: 09/086,475

[22] Filed: May 28, 1998

Related U.S. Application Data

[63] Continuation of application No. 09/042,716, Mar. 17, 1998.

[30] Foreign Application Priority Data

| Mar. 21, 1997 | [JP] | Japan | ................................... 9-087371 |
| Dec. 26, 1997 | [JP] | Japan | ................................... 9-361109 |

[51] Int. Cl.[7] ................................................ C23C 16/00
[52] U.S. Cl. ..................... 118/724; 118/715; 118/725; 427/248.1; 427/255.23; 432/241
[58] Field of Search ................................ 118/715, 724, 118/719, 725; 427/248.1, 255.23; 432/2, 64, 241

[56] References Cited

U.S. PATENT DOCUMENTS

| 5,029,554 | 7/1991 | Miyashita et al. .................. 118/715 |
| 5,088,922 | 2/1992 | Kakizaki et al. ................... 432/152 |
| 5,246,500 | 9/1993 | Samata et al. ..................... 118/719 |
| 5,271,732 | 12/1993 | Yokokawa ......................... 432/241 |
| 5,316,794 | 5/1994 | Carlson et al. ................... 427/248.1 |
| 5,330,352 | 7/1994 | Watanabe et al. .................. 432/152 |
| 5,365,772 | 11/1994 | Ueda et al. ......................... 73/40.7 |
| 5,370,371 | 12/1994 | Miyagi et al. ...................... 266/256 |
| 5,433,784 | 7/1995 | Miyagi et al. ...................... 118/715 |
| 5,445,521 | 8/1995 | Yamaguchi et al. ................... 432/5 |
| 5,462,397 | 10/1995 | Iwabuchi ........................... 414/222 |
| 5,540,782 | 7/1996 | Miyagi et al. ...................... 118/724 |
| 5,554,226 | 9/1996 | Okase et al. ....................... 118/724 |
| 5,562,383 | 10/1996 | Iwai et al. ......................... 414/217 |
| 5,578,132 | 11/1996 | Yamaga et al. ..................... 118/724 |
| 5,697,749 | 12/1997 | Iwabuchi et al. .................. 414/217 |
| 5,750,436 | 5/1998 | Yamaga et al. ..................... 438/558 |
| 5,777,300 | 7/1998 | Homma et al. ..................... 219/679 |
| 5,888,579 | 3/1999 | Lun .................................... 427/8 |

*Primary Examiner*—Jeffrie R Lund
*Attorney, Agent, or Firm*—Oliff & Berridge, PLC

[57] ABSTRACT

A substrate processing apparatus and method restrains outside air and gas-phase backward flow from entering the inside of a reaction chamber during a time period that the inside of the reaction chamber is opened to the outside through a substrate carrying-in/carrying-out opening. The substrate processing apparatus can comprise, for example, a vertical CVD apparatus having a gas supply system and a bypass line. The gas supply system supplies inert gas to a space between an outer tube and an inner tube of a reaction furnace during a boat loading period and a boat unloading period. The bypass line exhausts the atmosphere from the reaction chamber by a slow exhaust operation during the boat loading period and the boat unloading period.

26 Claims, 10 Drawing Sheets

FIG.4

| | WAFER CHARGING PROCESS | BOAT LOADING PROCESS | VACUUM EVACUATION PROCESS | FILM DEPOSITION PROCESS | AFTER-PURGING PROCESS | ATMOSPHERE RESTORING PROCESS | BOAT UNLOADING PROCESS | WAFER DISCHARGING PROCESS |
|---|---|---|---|---|---|---|---|---|
| BACK-PURGING OPERATION | NON-PERFORMED | PERFORMED | NON-PERFORMED | NON-PERFORMED | NON-PERFORMED | NON-PERFORMED | PERFORMED | NON-PERFORMED |
| SLOW EXHAUST OPERATION | NON-PERFORMED | PERFORMED | NON-PERFORMED | NON-PERFORMED | NON-PERFORMED | NON-PERFORMED | PERFORMED | NON-PERFORMED |

SUBSTRATE PROCESSING APPARATUS AND METHOD

This is a Continuation of application Ser. No. 09/042,716 filed Mar. 17, 1998. The entire disclosure of the prior application(s) is hereby incorporated by reference herein in its entirety.

BACKGROUND OF THE INVENTION

1. Field of the Invention

The present invention generally relates to a substrate processing apparatus and method for performing predetermined processing on a substrate by utilizing a chemical reaction in the inside of a reaction enclosure. Incidentally, for example, an enclosure of double structure is used as the reaction enclosure. Further, for instance, CVD (Chemical Vapor Deposition) processing is adopted as the predetermined processing. Furthermore, for example, a thermal CVD processing or a plasma CVD processing is employed as this CVD processing.

2. Description of the Related Art

Generally, a film deposition apparatus for forming a predetermined thin film on a surface of a wafer is needed for producing a semiconductor device.

Example of this film deposition apparatus is CVD apparatus for performing film deposition by utilizing a chemical reaction in a hermetically enclosed reaction space.

Further, an example of such a CVD apparatus is a batch type CVD apparatus for forming predetermined thin films on a plurality of wafers at a time.

Furthermore, an example of such a batch type CVD apparatus is a vertical CVD apparatus wherein the plurality of wafers, on each of which thin film should be formed, are placed by being arranged vertically so that the horizontal sections of the wafers overlap with one another.

In the case of this vertical CVD apparatus, for instance, a reaction furnace of double structure, which has an outer tube and an inner tube, is used as the reaction enclosure.

In the vertical CVD apparatus using a reaction furnace of double structure as the reaction enclosure, a carrying-in/carrying-out opening is usually provided in the bottom end portion of the reaction furnace. Further, in this CVD apparatus, reaction gas for film deposition is usually supplied from the bottom end portion of the reaction furnace. Moreover, atmosphere contained in the inside of the reaction furnace is evacuated from the top end portion thereof through a space provided between the outer tube and the inner tube.

FIG. 13 is a side sectional diagram showing the configuration of the conventional vertical CVD apparatus which has the aforementioned reaction furnace of double structure. Hereinafter, the configuration of this conventional vertical CVD apparatus will be described. Incidentally, in the following description, this vertical CVD apparatus will be described as a low pressure CVD apparatus.

Vertical CVD apparatus 100 shown in this figure has: a reaction system 110 for forming a predetermined thin film on a wafer W by utilizing a chemical reaction in the inside (reaction space) of a reaction chamber 1a; a carrier system 120 for carrying the wafer W into the reaction chamber 1a and for carrying the wafer W therefrom; a gas supply system 130 of supplying into the reaction chamber a reaction gas for a film deposition process, an inert gas for performing what is called an after-purging process, and an inert gas for performing what is called an atmosphere restoring process; and an exhaust system 140 for the vacuum exhaust process (namely, the vacuum pumping process) of the reaction chamber 1a.

Incidentally, the after-purging process is defined herein as a process consisting of the steps of supplying an inert gas into the reaction chamber 1a, and performing the vacuum-pumping of the reaction chamber 1a upon completion of the film deposition process, thereby purging the atmosphere away from the reaction chamber 1a by using the inert gas. Moreover, atmosphere restoring process is defined herein as a process consisting of the steps of stopping the vacuum exhaust process upon completion of the after-purging process, and then supplying an inert gas to the reaction chamber 1a, thereby restoring the inner pressure of the reaction chamber 1a to atmospheric pressure. This atmosphere restoring process is a process for preparing the apparatus for discharging the wafer W from the inside of the reaction chamber 1a.

The reaction system 110 has a reaction furnace 111 for forming the reaction chamber 1a. This reaction furnace 111 is configured as a reaction furnace of double structure that has an outer tube 1M and an inner tube 2M. Throat 2a, through which a wafer W is carried in or out, is provided in the bottom end portion of this reaction furnace 111.

Gas supply system 130 has a gas supply nozzle 131 that is used to supply a reaction gas for the film deposition process, an inert gas for the after-purging process, and another inert gas for the ambient gas restoring process. Gas blowoff opening 4a of this gas supply nozzle 131 is provided in the neighborhood of the throat 2a of the furnace 111.

Exhaust system 140 has a main exhaust line 141 for performing a primary exhaust operation, an over-pressurization preventing line 142 for performing an over-pressurization preventing operation, and a bypass line 143 for performing a slow exhaust operation.

Incidentally, the primary exhaust operation is herein defined as an operation of performing a vacuum exhaust process on the reaction chamber 1a at high speed by increasing the exhaust conductance thereof. Further, the over-pressurization preventing operation is a vacuum exhaust process preventing the inner pressure of the reaction chamber 1a from exceeding atmospheric pressure in the atmosphere restoring process upon completion of the after-purging process. Moreover, the slow exhaust operation is herein defined as an operation of performing the vacuum exhaust process of the reaction chamber 1a at low speed by decreasing the exhaust conductance thereof.

Atmosphere exhaust port 5a of the exhaust system 140 is provided at a place where an atmosphere contained in the inside of the reaction chamber 1a is exhausted from the bottom end portion thereof through the space 3a between the outer tube 1M and the inner tube 2M.

In the case of the apparatus of the aforementioned configuration, when performing the film deposition process, first, a wafer W to be used therefor is carried into the reaction chamber 1a by the carrier system 120. Upon completion of this carrying—into operation, a slow exhaust operation is performed on the reaction chamber 1a by a bypass line 143. In this case, the atmosphere in the reaction chamber 1a is discharged from top end portion of the reaction furnace 111 through a space 3a between the outer tube 1M and the inner tube 2M.

When the degree of vacuum reaches a predetermined value as a result of a vacuum pumping process, a reaction gas for the film deposition is supplied by the gas supply system 130 to the vicinity of the throat 2a. Further, a primary exhaust operation is performed on the reaction chamber 1*a* by using a primary exhaust line 141. Thus, the reaction gas flows from the bottom portion (namely, a gas supply side) of the reaction furnace 111 to the top portion (namely, an exhaust side) and is dispersed into the reaction chamber 1*a*. As a consequence, predetermined thin film is formed on the surface of the wafer W. Moreover, an unreacted gas (namely, a part of the reaction gas, which does not react chemically) and the vapor of a reaction by-product are discharged from the top portion of the reaction furnace 111 through the space 3*a*.

When predetermined thin film is deposited on the surface of the wafer W, an inert gas is supplied by the gas supply system 130 to the reaction chamber 1*a*. At that time, the primary exhaust operation having been performed by the line 141 is continued without interruption. Consequently, the atmosphere in the reaction chamber 1*a* is purged by the inert gas. Upon completion of this after-purging process, the primary exhaust operation is terminated. Thus, only the operation of supplying the inert gas is continued. Thereby, the internal pressure of the reaction chamber 1*a* is increased.

When the internal pressure of the reaction chamber 1*a* exceeds atmospheric pressure, a vacuum exhaust process is performed on the reaction chamber 1*a* by the over-pressurization preventing line 142. Thus, the internal pressure of the reaction chamber 1*a* is maintained at atmospheric pressure. Thereafter, the operations of supplying the inert gas and preventing the over-pressurization are terminated with predetermined timing. Then, the wafer W, on which thin film is deposited, is carried out of the reaction chamber 1*a*.

In the herein-above description, there has described the configuration and operation of the conventional vertical CVD apparatus that has the reaction furnace 111 of the double structure.

However, in the case of the conventional vertical CVD apparatus 100 of the aforementioned configuration, during a time period when the inside of the reaction chamber 1*a* is opened to the outside through the throat 2*a*, outside air enters the inside of the reaction chamber 1*a* through this entrance 2*a*. Moreover, a gas-phase backward flow enters the reaction chamber 1*a* from an atmosphere exhaust path of the exhaust system 140. Thus, the vertical CVD apparatus has encountered the following four problems that (1) First, during the time the inside of the reaction chamber 1*a* is opened to the outside through the throat 2*a*, the outside air enters the inside of the reaction chamber 1*a*. Thus, the inside of the reaction chamber 1*a* is contaminated.

(2) Second, during the time the inside of the reaction chamber 1*a* is opened to the outside through the throat 2*a*, the outside air enters the inside of the reaction chamber 1*a*. Thus, particles are generated in the reaction chamber 1*a*.

Namely, even after the after-purging process is performed, a trace amount of unreacted gas is present in the reaction chamber 1*a* as a residue. When the outside air enters the inside of the reaction chamber 1*a*, this unreacted gas is mixed with water vapor contained in this outside air. This results in the generation of a contaminant. This contaminant acts as the particle. Therefore, when the outside air enters the inside of the reaction chamber 1*a* during the time the inside of the reaction chamber 1*a* is opened to the outside through the throat 2*a*, the particles are generated in the reaction chamber 1*a*.

(3) Third, when performing the film deposition process, a haze (or mist) is generated on the surface of a wafer W in the case that the outside air enters the inside of the reaction chamber 1*a* during the time the inside of the reaction chamber 1*a* is opened to the outside through the entrance 2*a*.

Namely, when the outside air enters the inside of the reaction chamber 1*a* during the time the inside of the reaction chamber 1*a* is opened to the outside through the throat 2*a*, vapor (outgassed), which is generated from a reaction by-product stuck onto the inner wall in the vicinity of the throat 2*a*, flows backward into the reaction chamber 1*a*. Thus, when forming film, a haze is produced due to this vapor on the surface of a wafer W.

(4) Fourth, in a time period during which the inside of the reaction chamber 1*a* is opened to the outside through the throat 2*a*, the inside of the reaction chamber 1*a* is contaminated by the gas-phase backward flow from the atmosphere exhaust path of the exhaust system 140 thereto.

Namely, when coming into contact with a low-temperature portion during discharge through the atmosphere exhaust path of the exhaust system 140, the unreacted gas or the vapor generated from the reaction by-product solidifies. This solidified gas is stuck onto the internal metallic surface of the atmosphere exhaust path or onto the quartz members therein as a reaction by-product. When the amount of this deposited by-product becomes large, this by-product may peel off the inner surface of the exhaust path and become particles.

Thus, in a time period during which the inside of the reaction chamber 1*a* is opened to the outside through the throat 2*a*, such particles flow from the atmosphere exhaust path of the exhaust system 140 into the inside of the reaction chamber 1*a* when the gas-phase backward flow enters the inside of the reaction chamber 1*a* from the atmosphere exhaust path of the exhaust system 140. As a result, the inside of the reaction chamber 1*a* is contaminated.

The present invention is accomplished to solve the aforementioned problems of the conventional apparatus and method.

SUMMARY OF THE INVENTION

Accordingly, an object of the present invention is to provide a substrate processing apparatus and method, by which an outside air and a gas-phase backward flow are restrained from entering the inside of a reaction chamber during the time the inside of a reaction chamber is opened to the outside through a substrate carrying-in/carrying-out opening.

To achieve the foregoing objects, in accordance with an aspect of the present invention, there is provided a substrate processing apparatus (hereunder sometimes referred to as a first substrate processing apparatus of the present invention) for performing a predetermined processing on a substrate by utilizing a chemical reaction in a reaction enclosure, which comprises: a reaction enclosure of double structure having: outer and inner tubular elements nearly coaxially provided therein; a first end portion in which a substrate carrying-in/carrying-out opening is provided and through which a reaction gas for processing a substrate is supplied; and a second end portion from which internal atmosphere is discharged through a space between the outer and inner tubular elements, and which further comprises: inert gas supply means for supplying an inert gas to the space between the outer and inner tubular elements in a predetermined term within a time period during which an inside of the reaction enclosure is opened to an outside through a substrate carrying-in/carrying-out opening; and atmosphere exhaust means for exhausting an atmosphere contained in the reaction enclosure by using an atmosphere exhaust path for performing a substrate processing in the predetermined term within the time period during which the inside of the reaction enclosure is opened to the outside through the substrate carrying-in/carrying-out openings.

In the case of this first substrate processing apparatus of the present invention, during a predetermined term within a time period in which an inside of the reaction enclosure is opened to an outside through a substrate carrying-in/carrying-out opening, an inert gas is supplied by the inner gas supply means to the space between the outer and inner tubular elements. Thus, the inner gas is supplied to the inside of the reaction enclosure from an exhaust port side from which an unreacted gas and so on is exhausted. In other words, the inert gas is supplied from the side opposite to the substrate carrying-in/carrying-out opening. As a result, the outside air is restrained from entering(or intruding into) the inside of the reaction chamber.

Moreover, during this term, the atmosphere contained in the reaction chamber is exhausted by the atmosphere exhaust means through the atmosphere exhaust path for processing a substrate. Thus, a gas-phase backward flow is restrained from entering the inside of the reaction enclosure from the atmosphere exhaust path for processing a substrate.

In the case of an embodiment (hereunder referred to as a second substrate processing apparatus of the present invention) of the first substrate processing apparatus, the predetermined term is a term during which a substrate is carried into and carried out of the reaction enclosure through the substrate carrying-in/carrying-out opening.

In the case of this second substrate processing apparatus of the present invention, the supplying of the inert gas into the reaction enclosure and the exhausting of the atmosphere contained in the reaction enclosure therefrom are performed during the term when the substrate to be processed is carried into the reaction enclosure and during the term when the processed substrate is carried out of the inside of the reaction enclosure. Thus, the consumption of the inert gas can be reduced in comparison with a configuration where the supplying of the inert gas and the exhausting of the atmosphere are always performed during the time period when the inside of the reaction enclosure is opened to the outside through the substrate carrying-in/carrying-out openings. Further, in the case of this second substrate processing apparatus, an ordinary O-ring can be employed in the atmosphere exhaust path, instead of an expensive high-heat-resistance O-ring. Thus, in the case that the O-ring is replaced with a new one when performing maintenance, the running cost can be decreased.

In the case of an embodiment (hereunder sometimes referred to as a third substrate processing apparatus of the present invention) of the first or second substrate processing apparatus of the present invention, the atmosphere exhaust means is adapted in such a manner as to exhaust the atmosphere contained in the reaction enclosure by performing a slow exhaust operation.

Thus, in the case of this third substrate processing apparatus of the present invention, the atmosphere in the reaction enclosure is exhausted by performing the slow exhaust operation. Thereby, a variation in internal pressure of the reaction enclosure due to the exhaust of the atmosphere in the reaction enclosure can be restrained. As a result, particles can be prevented from increasing owing to the following facts that this variation in the internal pressure causes film, which is deposited on the outer and inner tubular elements, to peel off and that such variation in the internal pressure causes the reaction by-products, which are deposited on the inner portion of the atmosphere exhaust path and on the inner wall in the vicinity of the substrate carrying-in/carrying-out opening, to come off and rise in the inner space of the reaction enclosure.

In the case of an embodiment (hereunder referred to as a fourth substrate processing apparatus of the present invention) of the first, second or third substrate processing apparatus of the present invention, a flow rate of an inert gas supplied from the inert gas supply means is set in such a manner as to be higher than a flow rate of an atmosphere exhausted by the atmosphere exhaust means.

In the case of this fourth substrate processing apparatus of the present invention, the flow rate of the inert gas is set in such a way as to be higher than the flow rate of the atmosphere. Thus, the internal pressure of the reaction enclosure is set as a positive pressure. Thereby, as compared with the case that the flow rate of the inert gas is equal to or less than the flow rate of the atmosphere, the advantageous effect of preventing the outside air from entering the reaction enclosure can be enhanced.

In the case of an embodiment (hereunder sometimes referred to as a fifth substrate apparatus of the present invention) of the first, second, third or fourth substrate processing apparatus of the present invention, a gas supply opening of the inert gas supply means is provided at a place where reaction by-products deposited on one or more inner walls of the reaction enclosure, which face the space between the outer and inner tubular elements and are in the vicinity of an atmosphere exhaust port for processing a substrate, are prevented from coming off and rising in the space.

In the case of this fifth substrate processing apparatus of the present invention, the gas supply opening of the inert gas supply means is provided at a place where reaction by-products deposited on the inner walls established in the vicinity of the atmosphere exhaust opening for processing a substrate are prevented from coming off and rising in the space. Thus, the generation of the particles due to the rise of the reaction by-product into the space can be restrained.

An embodiment (hereunder sometimes referred to as a sixth substrate processing apparatus of the present invention) of the first, second, third, fourth or fifth substrate processing apparatus of the present invention further comprises heating means for heating a substrate carried into the reaction enclosure. In this sixth substrate processing apparatus of the present invention, a gas supply opening of the inert gas supply means is provided at a place where the substrate is heated by this heating means.

In the case of this sixth substrate processing apparatus of the present invention, the gas supply opening of the gas supply means is provided at the position where the substrate is heated by the heating means. Thus, this gas supply opening can be provided at a place where no reaction by-product is deposited on the inner walls between the outer and inner tubular elements. Consequently, the generation of the particles due to the raising of the reaction by-product can be restrained.

In the case of an embodiment (hereunder sometimes referred to as a seventh substrate processing apparatus of the present invention) of the first, second, third, fourth, fifth or sixth substrate processing apparatus of the present invention, a plurality of gas supply openings of the inert gas supply means are provided.

In the case of this seventh substrate processing apparatus of the present invention, a plurality of gas supply openings are provided. Thus, the flow velocity of the inert gas can be restrained. Further, the plurality of gas supply openings may be suitably different from one another in respect of at least one of the position, orientation and size of the gas supply opening.

As is understood from the foregoing description, an occurrence of convection of the inert gas in the space can be restrained. Thus, the raising of the reaction by-product into the space owing to the convection of the inert gas can be prevented. Consequently, an increase in particles due to the convection of the inert gas can be restrained.

Moreover, with such a configuration, the inert gas can be supplied to the entire space between the outer and inner tubular elements. Therefore, the inert gas can be fed to the entire inside of the reaction enclosure. Consequently, the outside air can be effectively prevented from entering the reaction enclosure through the substrate carrying-in/carrying-out opening.

In the case of an embodiment (hereunder sometimes referred to as an eighth substrate processing apparatus of the present invention) of the seventh substrate processing apparatus of the present invention, the plurality of gas supply openings are distributedly provided along a periphery of the inner tubular element. Further, a direction, in which the inert gas is supplied from each of the plurality of gas supply openings, is directed toward the second end portion of the reaction enclosure.

Thus, in the case of this eighth substrate processing apparatus of the present invention, the plurality of gas supply openings are distributedly provided along a periphery of the inner tubular element, and moreover, a direction, in which the inert gas is supplied from each of the plurality of gas supply openings, is directed toward the second end portion of the reaction enclosure. Consequently, the generation of convection of the inert gas can be restrained. Furthermore, the inert gas can be supplied to the entire space between the outer and inner tubular elements.

In the case of an embodiment (hereunder sometimes referred to as a ninth substrate processing apparatus of the present invention) of the first, second, third, fourth, fifth, sixth, seventh or eighth substrate processing apparatus of the present invention, the inert gas supply means is adapted to be able to control a flow rate of an inert gas to be supplied to an inside of the reaction enclosure, and the atmosphere exhaust means are adapted to be able to control a flow rate of an atmosphere to be exhausted from an inside of the reaction enclosure.

Thus, in the case of this ninth substrate processing apparatus of the present invention, the flow rate of the inert gas and the flow rate of the atmosphere can be controlled. Therefore, these flow rates can be set so that the intrusion of the outside air into the reaction enclosure and of the gas-phase backward flow can be prevented.

In the case of an embodiment (hereunder sometimes referred to as a tenth substrate processing apparatus of the present invention) of the ninth substrate processing apparatus of the present invention, the atmosphere exhaust means has: exhaust means for exhausting an atmosphere contained in the reaction enclosure; detection means for detecting a flow rate of an atmosphere to be exhausted by the exhaust means; and control means for controlling the flow rate of the atmosphere exhausted by the exhaust means so that the flow rate detected by the detection means has a predetermined value.

Thus, in the case of this tenth substrate processing apparatus of the present invention, the flow rate of the atmosphere to be exhausted by the exhaust means is detected by the detection means. Further, the flow rate of the atmosphere to be exhausted by the exhaust means is controlled by the control means so that the flow rate detected by the detection means becomes a predetermined flow rate.

Thereby, the flow rate of the atmosphere to be exhausted by the exhaust means is automatically controlled. As a consequence, even if a factor, by which a change in this flow rate can be caused, occurs after the flow rate of the atmosphere to be exhausted by the exhaust means is preliminarily set at a predetermined value, such a change in the flow rate can be prevented.

To achieve the foregoing objects of the present invention, in accordance with another aspect of the present invention, there is provided a substrate processing method for performing a predetermined processing on a substrate by utilizing a chemical reaction in a reaction enclosure which is a reaction enclosure of double structure having: outer and inner tubular elements nearly coaxially provided therein; a first end portion in which a substrate carrying-in/carrying-out opening is provided and through which a reaction gas for processing a substrate is supplied; and a second end portion from which internal atmosphere is discharged through a space between the outer and inner tubular elements. This method comprises a step of supplying an inert gas to the space between the outer and inner tubular elements in a predetermined term within a time period during which an inside of the reaction enclosure is opened to an outside through a substrate carrying-in/carrying-out opening; and a step of exhausting the atmosphere by using an atmosphere exhaust path for performing a substrate processing in the predetermined term within the time period during which the inside of the reaction enclosure is opened to the outside through the substrate carrying-in/carrying-out openings.

In the case of this substrate processing method of the present invention, during a predetermined term within a time period in which an inside of the reaction enclosure is opened to an outside through a substrate carrying-in/carrying-out opening, an inert gas is supplied to the space between the outer and inner tubular elements. Moreover, during this term, the atmosphere contained in the reaction enclosure is exhausted through the atmosphere exhaust path for processing a substrate. Thus, the outside air is prevented from entering the inside of the reaction enclosure. Moreover, a gas-phase backward flow is restrained from entering the inside of the reaction enclosure from the atmosphere exhaust path for processing a substrate.

To attain the foregoing objects, in accordance with still another aspect of the present invention, there is provided a substrate processing apparatus (hereunder sometimes referred to as an eleventh substrate processing apparatus of the present invention) for performing a predetermined processing on a substrate by utilizing a chemical reaction in a reaction enclosure that has a first end portion in which a substrate carrying-in/carrying-out opening is provided. This apparatus comprises: heating means, placed around the reaction enclosure, for heating a substrate carried into the reaction enclosure through the substrate carrying-in/carrying-out opening; inert gas supply means for supplying an inert gas to an inside of the reaction enclosure from a part, which is placed at a second end portion of the reaction enclosure and is to be heated by the heating means, in a predetermined term within a time period during which an inside of the reaction enclosure is opened to an outside through a substrate carrying-in/carrying-out opening; and atmosphere exhaust means for exhausting an atmosphere contained in the reaction enclosure by a vacuum pumping by carrying out a slow exhaust operation, and by using an atmosphere exhaust path for performing a substrate processing in the predetermined term within the time period during which the inside of the reaction enclosure is opened to the outside through the substrate carrying-in/carrying-out openings.

Thus, in the case of this eleventh substrate processing apparatus of the present invention, an inert gas is supplied by the inert gas supply means to the inside of the reaction enclosure from a part, which is placed at a second end portion of the reaction enclosure and is to be heated by the heating means, in the predetermined term within the time period during which an inside of the reaction enclosure is opened to an outside through a substrate carrying-in/carrying-out opening. Thereby, the inert gas is fed to the inside of the reaction enclosure from a side opposite to the substrate carrying-in/carrying-out side thereof. Consequently, the outside air is restrained from entering the inside of the reaction enclosure.

Further, in this term, the atmosphere contained in the reaction enclosure is discharged therefrom by the atmosphere exhaust means through the atmosphere exhaust path for the substrate processing. Thus, the gas-phase backward flow is prevented from flowing into the reaction enclosure from the atmosphere exhaust path.

Furthermore, in the case of this eleventh substrate processing apparatus of the present invention, when the atmosphere in the reaction enclosure is discharged by the atmosphere exhaust means, the discharge of the atmosphere is conducted by performing a slow exhaust operation. Thereby, a variation in internal pressure of the reaction enclosure due to the exhaust of the atmosphere in the reaction enclosure can be restrained. As a result, particles can be prevented from increasing owing to the following facts that this variation in the internal pressure causes film, which is deposited on the inner wall of the reaction enclosure, to peel off and that such variation in the internal pressure causes the reaction by-products, which are deposited on the inner wall of the atmosphere exhaust path and on the inner wall in the vicinity of the substrate carrying-in/carrying-out opening, to come off and rise in the inner space of the reaction enclosure.

In the case of this eleventh substrate processing apparatus of the present invention, when supplying the inert gas in the reaction enclosure, this inert gas is supplied by the inert gas supply means to the inside of the reaction enclosure from a place, namely, a part, which is placed at the second end portion of the reaction enclosure and should be heated by the heating means. Thus, this gas supply opening can be provided at a place where no reaction by-product is deposited on the inside of the reaction enclosure. Consequently, the generation of the particles due to the raising of the reaction by-product can be restrained.

Incidentally, the eleventh substrate processing apparatus can be applied not only to a substrate processing apparatus provided with a reaction enclosure of double structure but to a substrate processing apparatus provided with a reaction enclosure of a single structure.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which:

FIG. 4 is a diagram illustrating operations, especially, a time period when performing a back-purging operation and a slow exhaust operation of the substrate processing apparatus which is the first embodiment of the present invention;

DETAILED DESCRIPTION OF THE PREFERRED EMBODIMENTS

Hereinafter, substrate processing apparatuses and methods embodying the present invention, which are the preferred embodiments of the present invention, will be described in detail by referring to the accompanying drawings.

1. First Embodiment 1-1. Configuration

Figure 1:
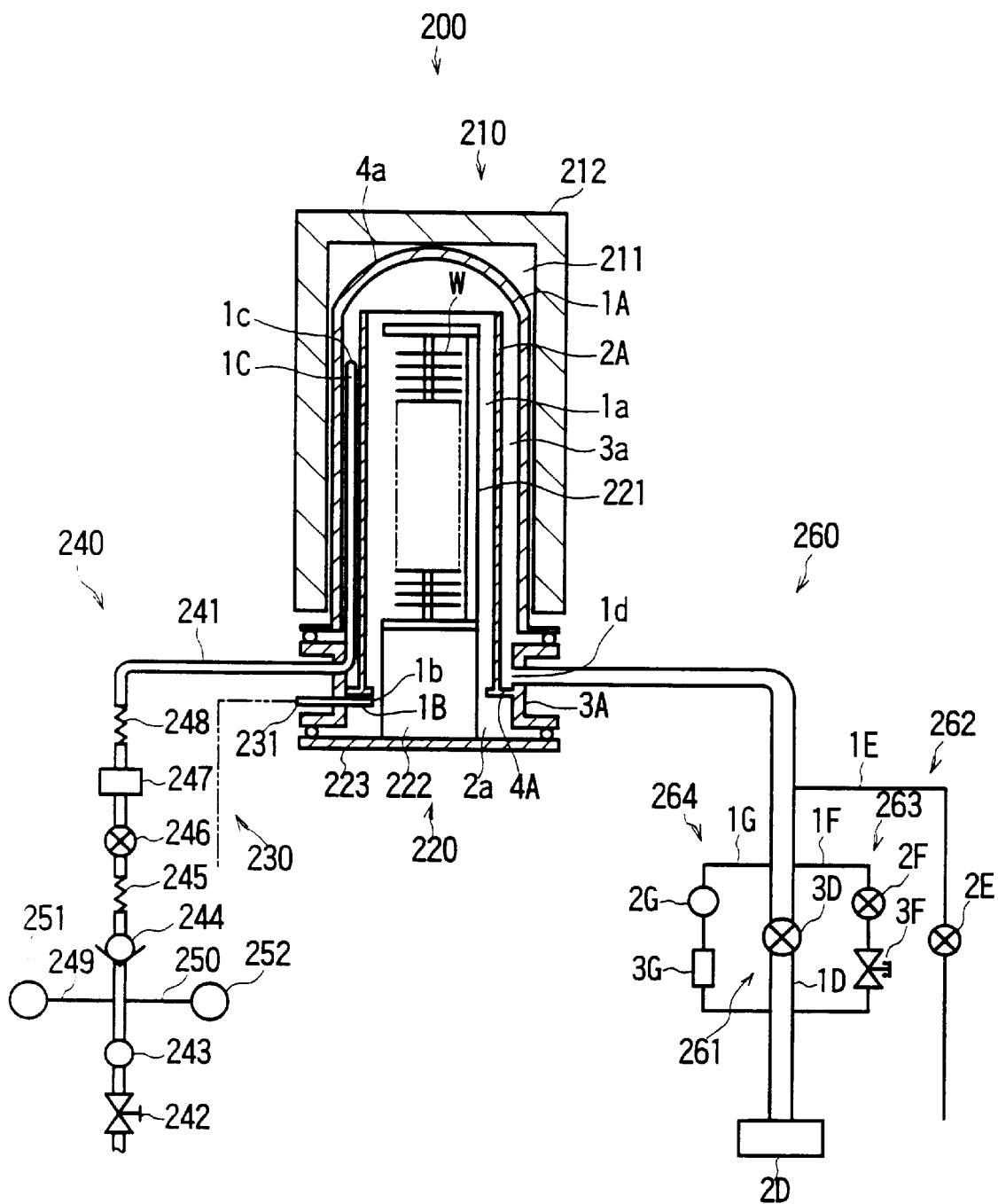
FIG. 1 is a sectional side diagram showing the configuration of a substrate processing apparatus embodying the present invention, which is a first embodiment of the present invention.

FIG. 1 is a side sectional diagram showing the configuration of a substrate processing apparatus embodying the present invention which is the first embodiment of the present invention. Incidentally, in this figure, a vertical CVD apparatus employing a reaction furnace of double structure as the reaction furnace (namely, the reaction enclosure) is illustrated as a typical example of applying the present invention to a substrate processing apparatus. Further, in the following description, the vertical CVD apparatus illustrated in this figure will be described by assuming that this CVD apparatus is a low pressure CVD apparatus.

Further, the major difference between the vertical CVD apparatus illustrated in this figure and the conventional vertical CVD apparatus resides in that the second gas supply system 240 and the second bypass line 264 are added to the CVD apparatus illustrated in this figure.

Namely, the vertical CVD apparatus 200 illustrated in this figure has: a reaction system 210 for forming a predetermined thin film on a surface of a wafer W by utilizing a chemical reaction in the inside of a reaction chamber 1*a*; a carrier system 220 for carrying the wafer W, on which the thin film should be deposited, into the reaction chamber 1*a* and for carrying the wafer W, on which the thin film is deposited, therefrom; a first gas supply system 230 for supplying into the reaction chamber 1*a* reaction gas for film deposition, an inert gas for performing what is called an after-purging process, and an inert gas for performing what is called an ambient pressure restoring process; the second gas supply system 240 for supplying to the reaction chamber 1*a* an inert gas for what is called a back-purging operation; and an exhaust system 260 for the vacuum pumping of the reaction chamber 1*a*.

Incidentally, the back-purging operation is defined herein as an operation of supplying an inert gas into the reaction chamber 1*a* from the top end portion thereof in the state in which the reaction chamber 1*a* is opened to the outside through an entrance (namely, a wafer carrying-in/carrying-out opening), thereby preventing the outside air from intruding into the reaction chamber 1*a*. Namely, the back-purging operation is defined herein as an operation of preventing the outside air from intruding into the reaction chamber 1*a* by supplying an inert gas into the reaction chamber 1*a* from an exhaust-side portion from which a reaction gas for film deposition is exhausted.

Incidentally, in the case of this first embodiment, this back-purging operation is performed in a wafer carrying-in term (or time period) when a wafer W, on which a thin film should be deposited, is carried into the reaction chamber 1*a*, and in a wafer carrying-out term when the wafer, on which the thin film is deposited, is carried out of the reaction chamber 1*a*, during a time period when the inside of the reaction chamber 1*a* is opened to the outside through the entrance 2*a*. In other words, the back-purging operation is performed in a boat loading term when a boat 221 (to be described later) is loaded into the reaction chamber 1*a*, and in a boat unloading term when this boat 221 is unloaded from the reaction chamber 1*a*.

The reaction system 210 has a reaction furnace 211 for forming the reaction chamber 1*a*. This reaction furnace 211 is configured as of double structure that has an outer tube 1A and an inner tube 2A.

Namely, the outer tube 1A is formed like a cylinder that has a top end portion, which is blocked up by an arched wall 4*a*, and has the bottom end portion which is opened. This outer tube 1A is put on the top end portion of a cylindrical (or tubular) throat flange 3A. Inner tube 2A is formed like a cylinder whose top and bottom end portions are opened. This inner tube 1A is nearly coaxially placed in the outer tube 2A. Further, this inner tube 1A is put on a ring-like collar 4A. This collar 4A is formed on the inner wall of a throat flange 3A. A throat 2*a* is provided in the bottom end portion of this reaction furnace 211.

Heater 212 for heating a wafer W carried into the reaction chamber 1*a* is provided around the reaction furnace 211.

The aforesaid carrier system 220 has a boat 221 for holding a wafer W, on which a thin film should be formed. This boat 221 is put on a throat cap 223 through a boat cap 222. This throat cap 223 has a function of sealing the throat 2*a* when performing a film deposition. Further, this throat cap 223 is adapted to move up and down by being driven by a boar elevator (not shown). A plurality of wafers W, each of which should be used for film deposition and extends in a horizontal direction, are stacked in a vertical direction and are accommodated in the boat 221.

The aforementioned first gas supply system 230 has a gas supply nozzle 231 that is used to supply to the reaction chamber 1*a* a reaction gas for the film deposition, an inert gas for the after-purging process, and another inert gas for the atmosphere pressure restoring process. Tip end portion 1B of this gas supply nozzle 231 extends under the collar 4A to the vicinity of the inner edge of the collar 4A through, for example, the throat flange 3A. Gas blowoff opening (namely, gas supply opening) 1*b* is formed at this tip end portion 1B. The direction in which gas blows from this gas blowoff opening 1*b* is set to a horizontal direction.

Figure 2:
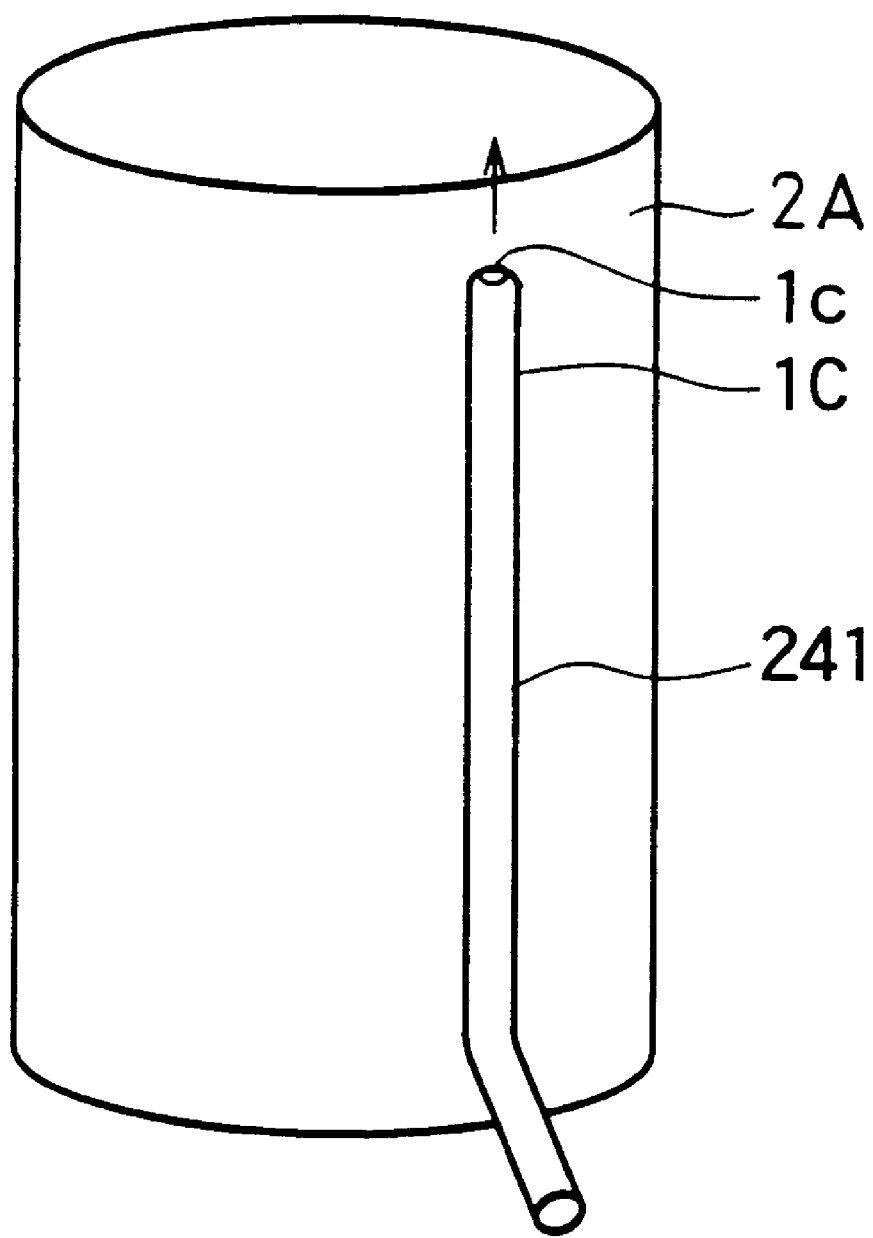
FIG. 2 is a perspective diagram showing the configuration of an inert gas supply piping of the substrate processing apparatus which is the first embodiment of the present invention.

The aforementioned second gas supply system 240 has an inert gas supply piping 241 that is used to supply to the reaction chamber 1*a* an inert gas for the back-purging operation. Tip end portion 1C of this inert gas supply piping 241 is led above the collar 4A to the space 3*a* between the outer tube 1A and the inner tube 2A through the throat flange 3A. In this case, this tip end portion 1C is extended to a place which is a little lower than the top end portion of, for instance, the inner tube 2A. Gas blowoff opening 1*c* is formed at this tip end portion 1C. As shown in FIG. 2, only one gas blowoff opening 1*c* is provided therein. Further, a direction in which gas blows from this gas blowoff opening 1*c* is set to an upward direction.

As a result of establishing the gas blowoff opening 1*c* in the space 3*a*, the inert gas for the back-purging process is supplied to the inside of the reaction chamber 1*a* from the top end side (namely, the side at which the reaction gas for the film deposition is exhausted). In other words, this inert gas is fed to the inside 1*a* from a side opposite to the entrance 2*a*.

Moreover, as a result of the fact that this gas blowoff opening 1*c* extends to a place which is a little lower than the top end portion of the inner tube 2A, this gas blowoff opening 1*c* is positioned at a place where a reaction by-product deposited on the inner wall in the vicinity of the atmosphere exhaust opening 1*d* of the exhaust system 260 among the inner walls of the reaction furnace 211 facing the space 3*a* is not raised. Furthermore, as a result of the fact that this gas blowoff opening 1*c* is extended to a place which is a little lower than the top end portion of the inner tube 2A, this gas blowoff opening 1*c* is positioned at a place where no reaction by-product is deposited thereto. This is because such a portion is maintained at a temperature, which is sufficiently high to the extent that no reaction by-product is deposited thereto, by being heated by the heater 212.

Hand valve 242, a regulator 243, a check valve 244, a first filter 245, a gate valve 246, a mass-flow controller 247 and a second filter 248 are inserted into the inert gas supply piping 241 in sequence in this order from upstream thereof. Further, a pressure gauge 251 and a pressure switch 252 are connected with this inert gas supply piping 241 through a first branch pipe 249 and a second branch pipe 250, respectively. The connection position at which the inert gas supply piping 241 and each of the pressure gauge 251 and the pressure switch 252 is established between a place, at which the regulator 243 is inserted into the inert gas supply piping 241, and another place, at which the check valve 244 is inserted into the piping 241.

Incidentally, for instance, nitrogen gas, helium gas and argon gas are employed as the inert gas supplied by this second gas supply system 240.

The aforesaid exhaust system 260 has a main exhaust line 261 for performing a primary exhaust operation, an over-pressurization preventing line 262 for performing an over-pressurization preventing operation, a first bypass line 263 for performing a slow exhaust operation, and a second bypass line 264 for similarly performing a slow exhaust operations.

Incidentally, the slow exhaust operation by the first bypass 263 is performed when starting the vacuum evacuation or exhaust process posterior to the boat loading process. In contrast, the slow exhaust operation by the second bypass line 264 is performed in the boat loading term and in the boat unloading term.

Additionally, the purposes of using the slow exhaust operation as the vacuum exhaust operation when starting the vacuum exhaust process after performing the boat loading process are as follows: First purpose is to prevent the boat 221 and the wafer W from being blown off and damaged by an air flow generated owing to variation in internal pressure of the reaction chamber 1a. Second purpose is to restrain particles from being generated by this air flow.

Namely, when performing vacuum exhaust (or pumping) on the reaction chamber 1a, the internal pressure of the reaction chamber 1a varies at the time of initiating the vacuum exhaust process. When the internal pressure of the reaction chamber 1a varies, an air flow occurs in the reaction chamber 1a. If this air current flows hard, the boat 221 and the wafer W are sometimes blown off and damaged. Moreover, even if the boat 221 and the wafer W are not blown off, the possibility of generating particles is high when an air flow occurs. When particles are produced after the boat loading process is performed, the yield of wafer W decreases.

Then, in the vacuum exhaust process after the boat loading process, first, the apparatus is adapted so that the vacuum exhaust process is performed by carrying out the slow exhaust operation. In the case of such an apparatus, when starting the vacuum exhaust process after performing the boat loading process, the variation in the internal pressure of the reaction chamber 1a is restrained. Thus, the generation of air flows is suppressed. As a result, the boat 221 and the wafer W are prevented from being damaged. Thus, particles are restrained from being generated.

Incidentally, in the case of the vacuum exhaust process after the boat loading process, when the internal pressure of the reaction chamber 1a is lowered to a predetermined value by the slow exhaust operation, a primary exhaust process is performed instead of the slow exhaust process.

The aforesaid primary exhaust line 261 has a primary exhaust piping 1D. This primary exhaust piping 1D has an end portion connected to the throat flange 3A. This connection position is established above the collar 4A. The other end portion of the primary exhaust piping 1D is connected to the vacuum pump 2D. Primary exhaust valve 3D is inserted into this primary exhaust piping 1D.

The aforementioned over-pressurization preventing line 262 has an over-pressurization preventing piping 1E. An end portion of this over-pressurization preventing piping 1E is connected to the primary exhaust piping 1D. This connection position is established at an upstream side of the primary exhaust valve 3D. Over-pressurization preventing valve 2E is inserted into this over-pressurization preventing piping 1E.

The aforementioned first bypass line 263 has a first bypass piping 1F. An end portion of this first bypass piping 1F is connected to the primary exhaust piping 1D at an upstream side of the primary exhaust valve 3D. The other end portion thereof is connected to the primary exhaust piping 1D at a downstream side of the primary exhaust valve 3D. In this case, the connection position between an end portion of the first bypass piping 1F and the primary exhaust piping 1D is established at a downstream side of the connection position of the over-pressurization preventing piping 1E therewith. First bypass valve 2F and a needle valve 3F are inserted into this first bypass piping 1F in sequence in this order from the upstream side.

The foregoing second bypass line 264 has a second bypass piping 1G. An end portion of this second bypass piping 1G is connected to the primary exhaust piping 1D at an upstream side of the primary exhaust valve 3D. The other end portion thereof is connected to the primary exhaust piping 1D at an downstream side of the primary exhaust valve 3D. In this case, the connection position between an end portion of the second bypass piping 1G and the primary exhaust piping 1D is established at a downstream side of the connection position of the over-pressurization preventing piping 1E therewith. Flow control valve 2G and a flow meter 3G are inserted into this second bypass piping 1G in sequence in this order from the upstream side.

1-2. Operation

Figure 3:
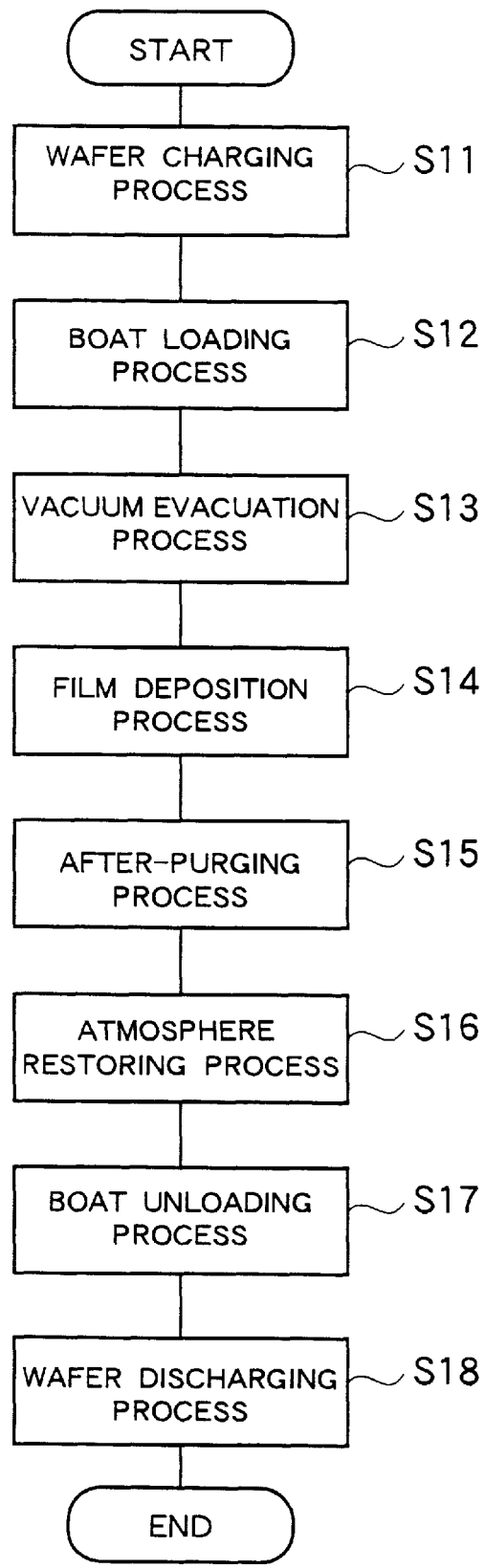
FIG. 3 is a flowchart illustrating an operation of the substrate processing apparatus which is the first embodiment of the present invention.
Figure 5:
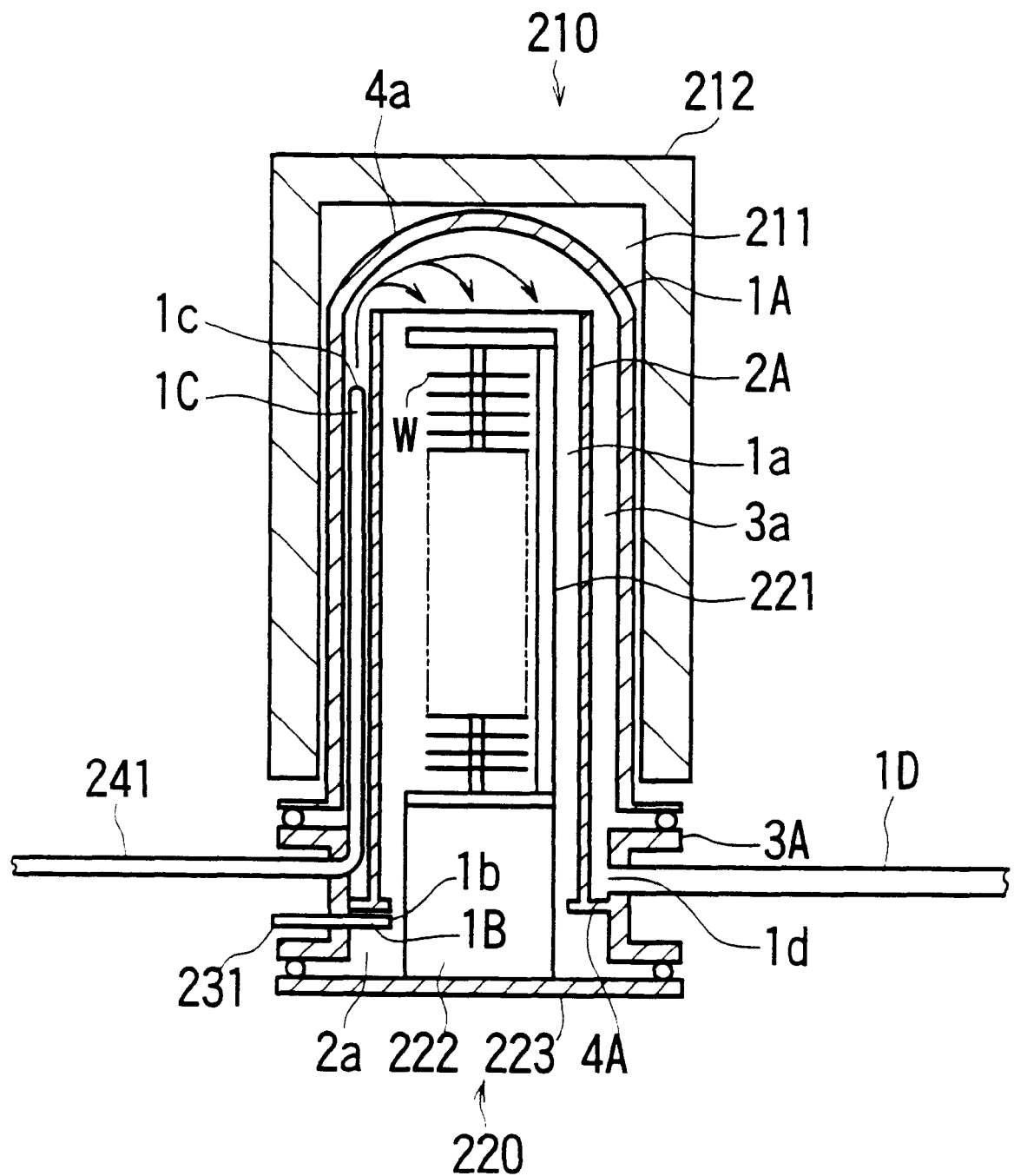
FIG. 5 is a diagram showing an operation of the substrate processing apparatus which is the first embodiment of the present invention, especially, a flow of an inert gas therein.

Operations of this embodiment with the aforementioned configuration will be described hereinbelow. First, an entire operation for forming a predetermined thin film on a surface of a wafer W will be described hereunder by referring to FIG. 3 which is a flowchart for illustrating such an operations.

Before commencing this operation, the heater 212 is set in a temperature rising state. Vacuum pump 2D is set in an exhaust operation state. If this operation is started in such conditions, first, a wafer charging process for charging a wafer W to the boat 221 is performed (in step S11). Namely, in this case, the throat cap 233 descends and the boat 221 is positioned under the reaction furnace 211. Thus, plural wafers W, on each of which thin film should be deposited, are charged into the boat 211 by the wafer carrier (not shown).

Upon completion of this wafer charging process, the boat loading process for carrying the boat 221 into the reaction chamber 1a is performed (in step S12). Namely, upon completion of the wafer charging process, the throat cap 223 is driven by the boat elevator (not shown) in such a way as to move up. Thus, the boat 221 is carried into the reaction chamber 1a. As a result, plural wafers W, on each of which thin film should be deposited, are carried into the reaction chamber 1a by being contained in the boat 221. At that time, the throat (or entrance) 2a is sealed by the entrance cap 223.

Then, upon completion of this boat loading process, the vacuum exhaust process for exhausting an atmosphere contained in the reaction chamber 1a is performed (in step S13). In this vacuum exhaust process, first, a slow exhaust operation is performed by the first bypass line 263. Then, when the internal pressure of the reaction chamber 1a lowers to a predetermined pressure as a result of this slow exhaust operation, a primary exhaust operation by the primary exhaust line 261 is performed.

Namely, when the boat loading process is terminated, first, the first bypass valve 2F is opened. Thereby, the atmosphere contained in the reaction chamber 1a is slowly exhausted through the first bypass piping 1F. In this case, the exhaust speed is controlled by the needle valve 3F.

Thereafter, when the internal pressure of the reaction chamber 1a is lowered to the predetermined pressure, the first bypass valve 2F is closed, while the primary exhaust valve 3D is opened. Thus, the atmosphere contained in the reaction chamber 1a is rapidly exhausted through the primary exhaust pipe 1D this time.

Thereafter, when the degree of vacuum of the reaction chamber 1a reaches a predetermined value and the internal temperature of the reaction chamber 1a is maintained at a predetermined temperature, a film deposition process is performed (in step S14). Namely, when the degree of vacuum of the reaction chamber 1a reaches the predetermined value and the internal temperature of the reaction chamber 1a is maintained at the predetermined temperature, a reaction gas is supplied to the vicinity of the throat 2a through the gas supply nozzle 231. Further, at that time, the primary exhaust operation by the primary exhaust line 261 is continued without being interrupted.

Thereby, the reaction gas supplied to the proximity of the throat 2a flows upwardly and is dispersed into an reaction chamber 1a. As a consequence, predetermined thin films are formed on the surface of the wafers W held in the boat 221. In this case, an unreacted gas or the vapor of a reaction by-product are exhausted from the top end portion of the reaction furnace 211 through the space 3a between the outer tube 1A and the inner tube 2A.

Upon completion of this film deposition process, the after-purging process is performed (in step S15). Namely, when the film deposition process is terminated, the supply of the reaction gas to the reaction chamber 1a is stopped. Instead, the supplying of an inert gas is started. This supply of the inert gas is also performed through the gas supply nozzle 231. Further, at that time, the primary exhaust process by the primary exhaust line 261 is continued. Consequently, the atmosphere contained in the reaction chamber 1a is purged by the inert gas. Thus, the unreacted residual gas or the like is exhausted.

Upon completion of this after-purging process, an atmosphere restoring process is performed (in step S16). Namely, when the after-purging process is terminated, the primary exhaust valve 3D is closed. Thus, the primary exhaust process is stopped. In contrast, the supply of the inert gas by the first gas supply system 230 is continued. Thus, the internal pressure of the reaction chamber 1a rises. Consequently, the internal pressure of the reaction chamber 1a is restored to an atmospheric pressure.

Incidentally, when the internal pressure of the reaction chamber 1a exceeds the atmospheric pressure, the over-pressurization preventing valve 2E is opened. Thus, the atmosphere contained in the reaction chamber 1a is exhausted through the over-pressurization preventing piping 1E. As a result, the internal pressure of the reaction chamber 1a is maintained at the atmospheric pressure. Atmospheric pressure sensor, which is used for detecting that the internal pressure of the reaction chamber 1a exceeds the atmospheric pressure, is provided on the primary exhaust pipe ID or a pipe which is branched from the throat flange 3A.

Upon completion of this atmosphere restoring process, a boat unloading process is performed (in step S17). Namely, when the atmosphere restoring process is terminated, the first gas supply system 230 stops supplying the inert gas to the reaction chamber 1a. Moreover, the throat cap 223 is driven by the boat elevator to descend. Thereby, the boat 221 is carried out of the reaction chamber 1a. As a result, the wafers W, on each of which the thin film is deposited, are carried out of the reaction chamber 1a by being in the condition that the wafers W are contained in the boat 221.

Upon completion of this boat unloading process, a wafer discharging process for carrying the wafers W, on each of which thin film is deposited, out of the boat 221 is performed (in step S18).

Thus, the entire operation for forming predetermined thin film on a wafer W is completed.

Next, the back-purging operation by the second gas supply system 240 and the slow exhaust operation by the second bypass line 264 will be described hereunder.

First, the back-purging operation by the second gas supply system 240 will be described. This operation is performed in the boat loading term and in the boat unloading term, as illustrated in FIG. 4. Namely, when the wafer charging process and the after-purging process are terminated, the gate valve (namely, an air valve) 246 is opened. Thereby, an inert gas is upwardly blown off from the gas blowoff opening 1c of the inert gas supply piping 241.

The inert gas blown off therefrom is led to the arched wall (namely, the ceiling) 4a formed on the top end portion of the outer tube 1A and is then led to the inside of the reaction chamber 1a. Thereby, the inert gas flows from the exhaust side of the reaction chamber 1a to the gas supply side thereof. As a result, in spite of the fact that the throat 2a is opened, the outside air is restrained from intruding into the inside of the reaction chamber 1a.

In this case, the flow rate of the inert gas is controlled by the mass-flow controller 247 in such a manner as to reach a value which is preliminarily determined. Moreover, the backward flow of the inert gas is prevented by the check valve 244. Further, impurities contained in the inert gas are eliminated by the first and second filters 245 and 248.

Further, the value of the pressure due to the inert gas is reduced to a suitable value by the regulator 243 from a high value. This is because the pressure of the inert gas outputted from a gas bomb (not shown) is usually set at a high value. Furthermore, the reason why the pressure of the inert gas outputted from the gas bomb is set at a high value is as follows: Namely, usually, the gas bomb is provided as factory equipment. Thus, the distance between the gas bomb and the reaction chamber 1a is rather long. Accordingly, the pressure of the inert gas outputted from the gas bomb is set at a high value.

Furthermore, it is detected by the pressure switch 252 whether or not the internal pressure of the inert gas supply piping 241 is the suitable value. If the internal pressure of the inert gas supply piping 241 is lower than the suitable value, the apparatus have encountered the problem that, even when letting the inert gas flow, the inert gas does not flow. In contrast, if the internal pressure of the piping 241 is higher than the suitable value, there is caused the problem that, when starting letting the inert gas flow, a large quantity of inert gas flows at a stretch.

In accordance with ordinary specifications, the pressure switch 252 is set in such a way as to detect a reduction in the pressure. Further, when a reduction in the pressure is detected by this pressure switch 252, an error routine is executed under the control of a controller (not shown). This controller is operative to control the apparatus. Usually, the suitable flow rate of the gas is set in the mass-flow controller 247 each of gases. The foregoing is the gist of the back-purging operation.

Next, the slow exhaust operation by the second bypass line 264 will be described hereinbelow. As shown in FIG. 4, this operation is performed in the boat loading term and the boat unloading term. Namely, when the wafer charging process or the atmosphere restoring process is terminated, the flow control valve 2G of the second bypass line 264 is opened. In this case, the primary exhaust valve 3D of the primary exhaust line 261, the over-pressurization preventing valve 2E of the over-pressurization preventing line 262 and the fist bypass valve 2F of the first bypass line 263 are closed. Thereby, the atmosphere in the reaction chamber $1a$ is exhausted through the second bypass piping 1G of the second bypass line 264. As a result, the gas-phase backward flow is restrained from entering the reaction chamber $1a$.

In this case, the flow rate of the atmosphere flowing through the second bypass piping 1G is detected by the flow meter 3G. Further, according to the result of this detection, the opening degree of the flow control valve 2G is controlled. Thus, the flow rate of the atmosphere is maintained at a predetermined flow rate. This flow rate is set in such a fashion as to be less than the flow rate of the inert gas supplied from the second gas supply system 240. Consequently, the internal pressure of the reaction chamber $1a$ is set at a positive pressure.

1-3. Advantageous Effects

In the case of the embodiment above described in detail, the following advantageous effects can be obtained.

(1) First, in the case of this embodiment, in the boat loading term and the boat unloading term, the inert gas is supplied to the space $3a$ between the outer tube 1A and the inner tube 2A. Thus, the inert gas can be supplied to the inside of the reaction chamber $1a$ from the side at which the unreacted gas and so on is exhausted. In other words, the inert gas can be supplied to the inside of the reaction chamber $1a$ from the portion opposite to the throat $2a$. Thereby, the outside air can be prevented from intruding into the inside of the reaction chamber $1a$. Consequently, the inside of the reaction chamber $1a$ is restrained from being contaminated owing to the intrusion of the outside air thereinto. Further, the generation of particles, the production of a haze on the surface of the wafer W and the growth of natural oxide film can be suppressed.

(2) Further, in the case of this embodiment, the atmosphere in the reaction chamber $1a$ is exhausted through the atmosphere exhaust path (strictly speaking, an upstream portion of the primary exhaust pipe 1D), which is used for processing wafers, instead of the dedicated atmosphere exhaust path. Thus, the gas-phase backward flow can be restrained from entering the inside of the reaction chamber $1a$ through the atmosphere exhaust path for processing wafers. Thus, the inside of the reaction chamber $1a$ can be restrained from being polluted owing to the back-diffusion of particles associated with the gas-phase backward flow.

(3) Furthermore, in the case of this embodiment, the operation (namely, the back-purging operation) of supplying the inert gas to the inside of the reaction chamber $1a$ and the process of exhausting the atmosphere in the reaction chamber $1a$ are performed only in the boat loading term and the boat unloading term within the time period when the inside of the reaction chamber $1a$ is opened to the outside through the throat $2a$. Thus, as compared with the configuration that the supply of the inert gas and the exhaust of the atmosphere are always performed in the time period when the reaction chamber $1a$ is opened to the outside through the throat $2a$, the consumption of the inert gas can be reduced. Moreover, in the case that O-rings provided in the piping 1D and 1G and so on of the exhaust system 260 are replaced with new one when performing maintenance, the running cost can be decreased. Namely, for the purpose of restraining an increase in the particles due to the gas-phase backward flow, it is preferable that the vacuum exhaust process is performed at all times in the time period when the reaction chamber $1a$ is opened to the outside through the throat $2a$.

However, this results in increase in the consumption of the inert gas. Further, high-temperature atmosphere in the reaction chamber $1a$ flows through the upstream side portion of the primary exhaust pipe 1D and the second bypass pipe 1G and so on for a long time. Therefore, the temperatures of these pipes 1D,1G and so on rise. Consequently, O-rings for vacuum sealing become easily damaged. Thus, high-heat-resistance expensive O-rings should be used. Consequently, the running cost in the case of replacing O-rings increases when performing maintenance.

In contrast with this, in the case of this embodiment, the vacuum exhaust process using the second bypass line 264 is performed only in the boat loading term and the boat unloading term. Thus, a rise in the temperature of the pipes 1D and 1G and so on can be decreased. Therefore, ordinary inexpensive O-rings can be used. Consequently, the running cost in the case of replacing O-rings with new ones when performing maintenance can be reduced.

Incidentally, the contamination of the wafers W due to the increase in the number of particles can be restrained even in the case that the vacuum exhaust process using the second bypass line 264 is performed only in the boat loading term and the boat unloading term. This is because such contamination of the wafers becomes a problem only in the case that the wafer W is placed in the vicinity of the reaction chamber $1a$ when the number of particles increases. Moreover, such a case occurs in the boat loading term and the boat unloading term within the time period when the reaction chamber $1a$ is opened to the outside through the throat $2a$.

(4) Moreover, in the case of this embodiment, in the case that the atmosphere in the reaction chamber $1a$ is exhausted in the boat loading term and the boat unloading term, the exhaust of the atmosphere is performed by the slow exhaust operation. Thus, the variation in the internal pressure of the reaction chamber $1a$ due to this exhaust of the atmosphere can be restrained. Thereby, the film deposited on the outer tube 1A and the inner tube 2A is prevented from coming off the tubes 1A,2A owing to this variation in the internal pressure. Moreover, reaction by-product deposited on the inner wall of the pipes 1D,1G and so on and on the inner wall in the vicinity of throat $2a$ is prevented from raising in the space owing to the variation in the internal pressure. Consequently, the particles can be restrained from increasing.

(5) Further, in the case of this embodiment, the flow rate of the inert gas supplied from the second gas supply line 240 to the inside of the reaction chamber $1a$ is established in such a manner as to be higher than the flow rate of the atmosphere exhausted from the inside of the reaction chamber $1a$ by using the second bypass line 264. Thus, the internal pressure of the reaction chamber $1a$ is set at the positive pressure. Thereby as compared with the case where the flow rate of the inert gas is equal to or less than the flow rate of the atmosphere, the advantageous effects of restraining the outside air from intruding into the reaction chamber $1a$ can be enhanced. In addition, thus, the growth of the natural oxide film can be preferably suppressed.

(6) Moreover, in the case of this embodiment, the gas blowoff opening $1c$ of the inert gas supply piping 241 is placed at a place where the reaction by-product deposited on the inner wall in the proximity of the atmosphere exhaust opening $1d$ among the inner walls of the reaction furnace 211 facing the space $3a$ between the outer tube 1A and the inner tube 2A is prevented from raising. Thus, the generation of particles due to the raising of the reaction by-product can be suppressed.

(7) Further, in the case of the first embodiment, the gas supply opening 1c of the inert gas supply piping 241 is positioned at a place to be heated by the heater 212. Thus, this gas supply opening 1c can be positioned at a place where no reaction by-product is present. Consequently, the generation of particles owing to the raising of the reaction by-product can be suppressed.

(8) Additionally, in the case of the first embodiment, the flow rate of the inert gas supplied by the second gas supply system 240 and the flow rate of the atmosphere to be exhausted by the second bypass line 264 can be controlled. Thus, flow rates, by which the intrusion of the outside air and the gas-phase backward flow are effectively suppressed, can be set.

(9) Further, in the case of this embodiment, the flow rate of the atmosphere to be exhausted by using the second bypass line 264 can be automatically controlled in such a manner as to be equal to a predetermined value. Thus, after this flow rate is set at the predetermined value, even if a factor changing such a flow rate occurs, such a change can be suppressed.

(10) Moreover, in the case of this embodiment, the gas blowoff opening 1c of the inert gas supply piping 241 is formed in such a manner as to extend to a place located a little lower than the top end portion of the inner tube 2A. Thus, the inert gas can easily reach the inside of the reaction chamber 1a.

1-4. Modifications (1) In the foregoing description, there has been described the apparatus using the mass-flow controller 247 as the flow control device of the second gas supply system 240. However, flow control devices other than the mass-flow controller 247 may be used.

(2) Further, in the foregoing description, there has been described the apparatus using the air valve as the flow control valve 2G of the second bypass line 264. However, a combination of an air valve and a needle valve may be used as the flow control valve.

2. Second Embodiment

Figure 6:
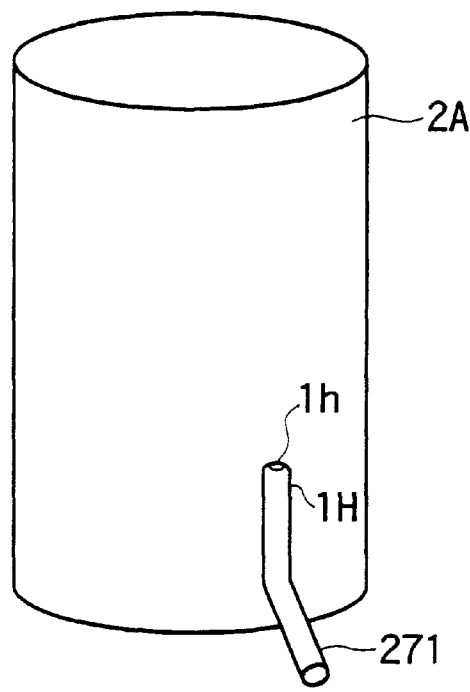
FIG. 6 is a perspective diagram showing the configuration of a primary part of another substrate processing apparatus embodying the present invention, which is a second embodiment of the present invention.

FIG. 6 is a perspective diagram showing the configuration of a primary part of another substrate processing apparatus embodying the present invention, which is a second embodiment of the present invention.

In the case of the aforementioned first embodiment, the tip end portion 1C of the inert gas supply piping 241 is extended to a place that is a little lower than the top end portion of the inner tube 1A. In contract, in the case of the second embodiment, the distance, by which the tip end portion 1C is extended, is shortened.

This manner is illustrated in FIG. 6. Incidentally, in FIG. 6, like reference characters designate like portions having nearly same functions of FIG. 1. Thus, the detailed descriptions of such portions are omitted herein.

In FIG. 6, reference numeral 271 denotes an inert gas supply piping of the second supply system 240 of the second embodiment. The tip end portion 1H of this inert gas supply piping 271 is led to the space 3a between the outer tube 1A and the inner tube 2A through the throat flange 3A, similarly as in the case of the inert gas supply piping 241 of FIG. 1. Further, the tip end portion 1H thereof extends to a place which is a little lower than the central portion in the axial direction of the inner tube 2A. Gas blowoff opening 1h is formed at this tip end portion 1H. Furthermore, the direction in which the gas is blown off, from the gas blowoff opening 1h, is set as an upward direction.

Even in the case of the second embodiment with such a configuration, the raising of the reaction by-product deposited on the inner wall in the vicinity of the atmosphere exhaust port 1d can be prevented by providing the tip end portion 1H of the inert gas supply pipe 271 on a side opposite to the place where the atmosphere exhaust port 1d is located.

Moreover, in the case of the second embodiment with such a configuration, the length of the inert gas supply piping 271 is short. Thus, the inert gas supply piping 271 can be easily attached to and detached from the substrate processing apparatus, when performing maintenance.

3. Third Embodiment

Figure 7:
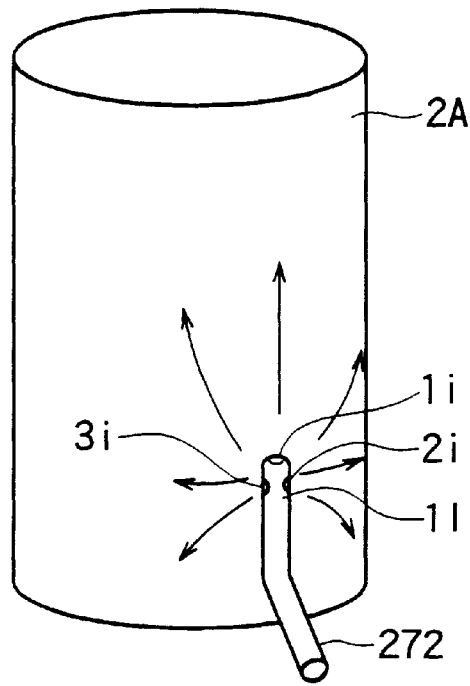
FIG. 7 is a perspective diagram showing the configuration of a primary part of still another substrate processing apparatus embodying the present invention, which is a third embodiment of the present invention.

FIG. 7 is a perspective diagram showing the configuration of still another substrate processing apparatus which is a third embodiment of the present invention.

In the case of the aforementioned first and second embodiments, only one gas blowoff opening (1c, 1h) is provided in the inert gas supply piping (241, 271). In contrast, in the case of the third embodiment, a plurality of gas blowoff openings are provided therein.

This configuration is illustrated in FIG. 7. Incidentally, in FIG. 7, like reference characters designate like portions having similar functions as of FIG. 1. Thus, the detailed descriptions of such portions are omitted herein.

In FIG. 7, reference numeral 272 denotes an inert gas supply piping of the second gas supply system 240 of the third embodiment. In this figure, there is shown a typical case that the tip end portion 1I extends to a place which is a little lower than the central portion of the inner tube 2A, similarly as in the case of the inert gas supply pipe 271 of FIG. 6.

Three gas blowoff openings 1i, 2i and 3i are formed in the tip end portion 1I of this inert gas supply piping 272. Further, the gas blowing direction, in which the inert gas is blown off, of the gas blowoff opening 1i is set as an upward direction. Furthermore, the gas blowing direction of the gas blowoff opening 2i is a rightward direction, as viewed in this figure. Moreover, the gas blowing direction of the gas blowoff opening 3i is a leftward direction, as viewed in this figure.

With such a configuration, an occurrence of convection of the inert gas in the space 3a between the outer tube 1A and the inner tube 2A can be restrained.

Figure 8:
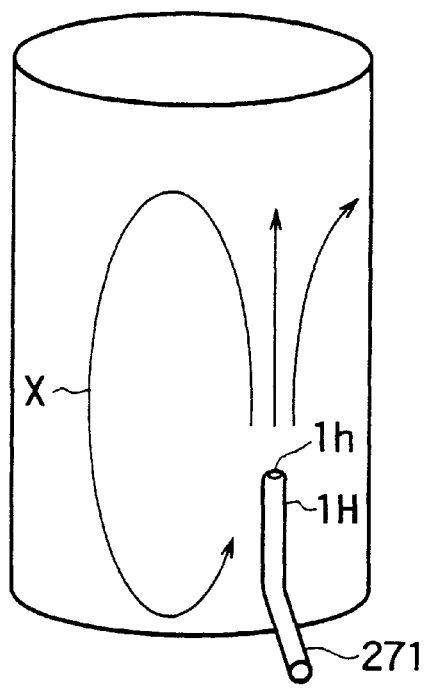
FIG. 8 is a diagram for illustrating advantageous effects of the substrate processing apparatus which is the third embodiment of the present invention.

Namely, in the case of the aforementioned first and second embodiments, only one blowoff opening 1c or 1d is provided as the gas blowoff openings. Thus, it is difficult to suppress the flow velocity of the inert gas. Moreover, the inert gas can be blown off only in one direction. Thereby, in the case of these embodiments, the convection occurs when the flow rate of the inert gas is increased in the space 3a between the outer tube 1A and the inner tube 2A shown in FIG. 8. Incidentally, FIG. 8 shows such a case in the second embodiment.

In contrast, in the case of the third embodiment, three gas blowoff openings 1i, 2i and 3i are provided, and further, the gas blowoff directions of them are established in such way as to be different from one another. Thus, even in the case that the flow rate of the inert gas is high, the flow rate of the inert gas can be restrained. Moreover, the inert gases can be blown off in different directions.

Thereby, in the case of the third embodiment, in spite of the fact that the three gas blowoff openings 1i, 2i and 3i are provided at a place in a localized manner, an occurrence of convection X of the inert gas can be restrained. As a result, in the case of the third embodiment, not only the raising of the reaction by-product (deposited on the inner wall in the vicinity of the atmosphere exhaust opening 1d) owing to the blowoff of the inert gas, but also the raising of the reaction by-product due to the convection X in the case of the high flow rate of the inert gas can be restrained. Thereby, in the case of the third embodiment, the generation of particles can be suppressed more effectively, in comparison with the aforementioned first and second embodiments.

Additionally, with the aforesaid configuration, the inert gas can be supplied to the entire space 3a in the case of the third embodiment. Thereby, the inert gas can be supplied to the entire inside of the reaction chamber 1a. Consequently, the outside air can be effectively prevented from intruding into the inside of the reaction chamber 1a.

4. Fourth Embodiment

Figure 9:
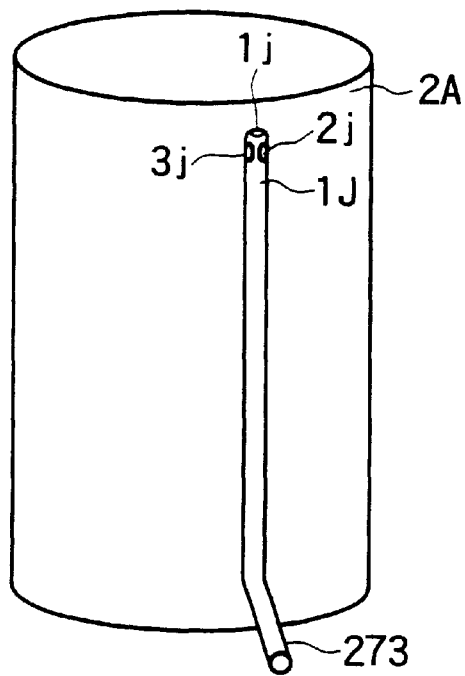
FIG. 9 is a perspective diagram showing the configuration of a primary part of yet another substrate processing apparatus embodying the present invention, which is a fourth embodiment of the present invention.

FIG. 9 is a perspective diagram showing the configuration of yet another substrate processing apparatus which is the fourth embodiment of the present invention.

Similarly as in the case of third embodiment, in the case of the fourth embodiment, three gas blowoff openings 1j, 2j and 3j are provided in the tip end portion 1J of the inert gas supply piping 273, of which the tip end portion 1J extends to a place near to the top end portion of the inner tube 2A, similarly as in the case of the first embodiment.

With such a configuration, the occurrence of convection X of the inert gas in the space 3a can be restrained. Moreover, the inert gas can be supplied to the entire space 3a. Consequently, the fourth embodiment has the advantageous effects similar to those of the third embodiment.

5. Fifth Embodiment

Figure 10:
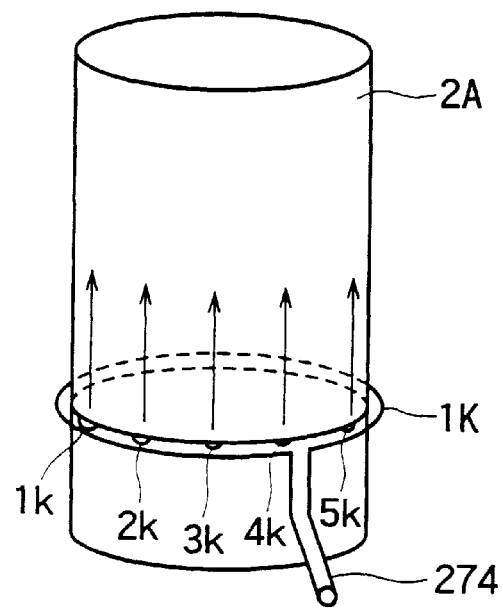
FIG. 10 is a perspective diagram showing the configuration of a primary part of a further substrate processing apparatus embodying the present invention, which is a fifth embodiment of the present invention.

FIG. 10 is a perspective diagram showing the configuration of a primary part of still another substrate processing apparatus which is a fifth embodiment of the present invention.

In the case of the aforementioned third and fourth embodiments, there has been described the case that plural gas blowoff openings are provided at a place in a localized manner. In contrast with this, in the case of the fifth embodiment, such gas blowoff openings are provided around the inner tube 2A in a distributed manner. Moreover, all of the gas blowing directions respectively corresponding to these openings are set as upward directions.

This is illustrated in FIG. 10. In this figure, reference numeral 274 designates the inert gas supply piping of the fifth embodiment. The tip end portion 1K of this inert gas supply piping 274 is formed like a ring surrounding the inner tube 2A. Further, plural gas blowoff openings 1k, 2k, ... 3k, 4k, 5k ... are provided along the periphery of the inner tube 2A at uniform intervals in this ring-like tip end portion 1K. These gas blowing directions corresponding to these gas blowoff openings, respectively, are set as upward directions. Incidentally, this figure shows the case that the tip end portion 1K of the inert gas supply piping 274 extends to a place which is a little lower than the central portion in the axial direction of the inner tube 2A.

With such a configuration, the flow velocity of the inert gas can be suppressed. As shown in FIG. 10, the inert gas can blow off parallel from plural gas blowoff openings 1k, 2k, 3k, 4k, 5k. Thereby, the generation of convection of the inert gas in the space 3a can be restrained. Moreover, the inert gas can be supplied to the entire space 3a.

6. Sixth Embodiment

Figure 11:
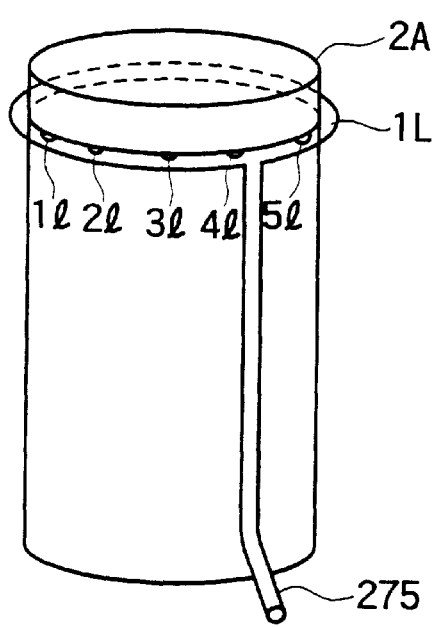
FIG. 11 is a perspective diagram showing the configuration of a primary part of still another substrate processing apparatus embodying the present invention, which is a sixth embodiment of the present invention.

FIG. 11 is a perspective diagram showing the configuration of a primary part of yet another substrate processing apparatus which is a sixth embodiment of the present invention.

In the case of this embodiment, the tip end portion of the inert gas supply piping extending to a place which is a little lower than the top end portion of the inner tube 2A is formed like a ring, similarly as in the case of the fifth embodiment.

This is illustrated in FIG. 11. In this figure, reference numeral 275 indicates an inert gas supply piping. The tip end portion 1L of this inert gas supply piping 275 is formed like a ring which surrounds the inner tube 2A. Plural gas blowoff openings 1l, 2l, 3l, 4l, 5l . . . are formed on the top surface of this tip portion 1L at uniform intervals.

With such a configuration, the generation of convection X of the inert gas in the space 3a can be restrained. Moreover, the inert gas can be supplied to the entire space 3a.

7. Seventh Embodiment

Figure 12:
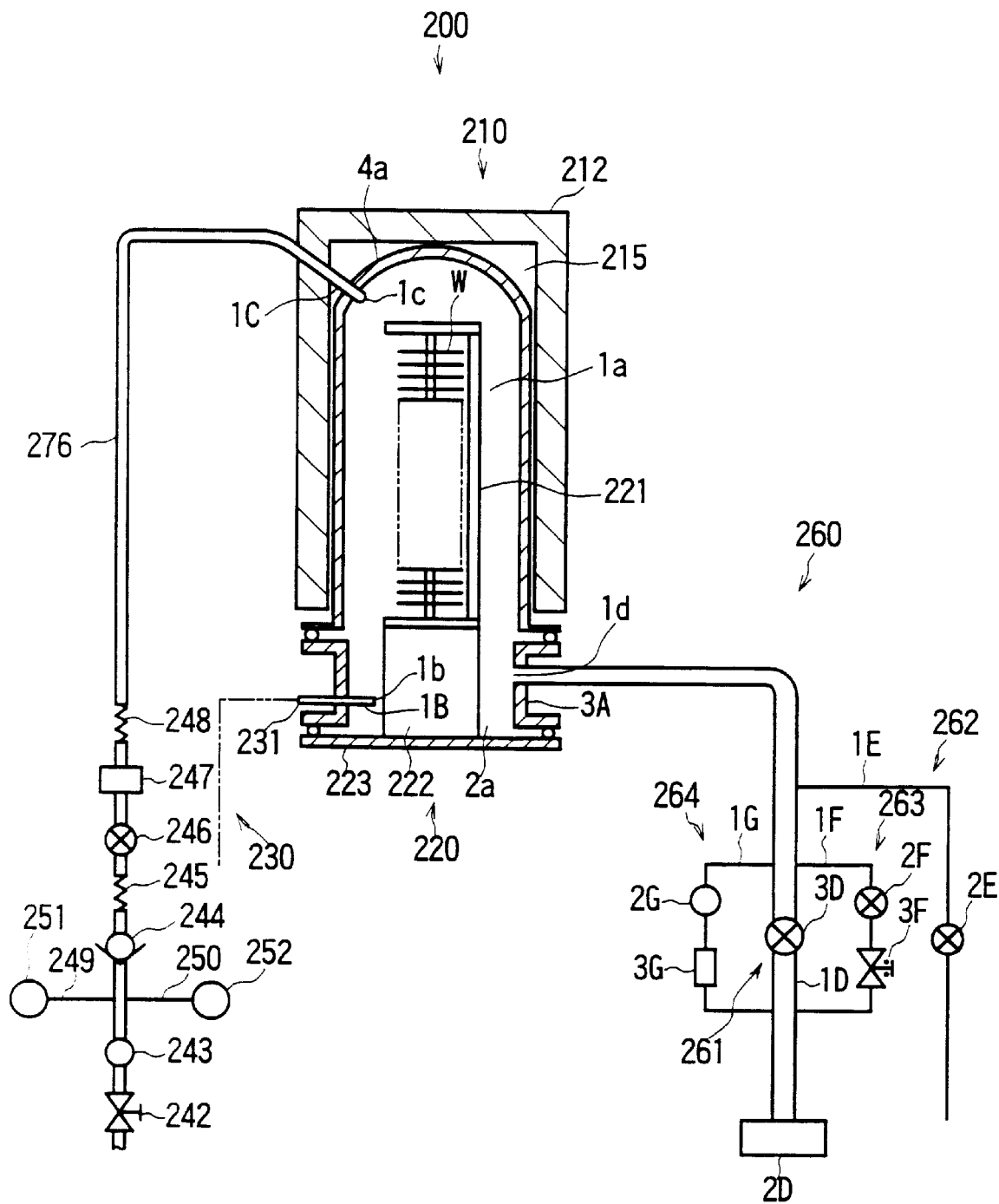
FIG. 12 is a perspective diagram showing the configuration of yet another substrate processing apparatus embodying the present invention, which is a seventh embodiment of the present invention.
Figure 13:
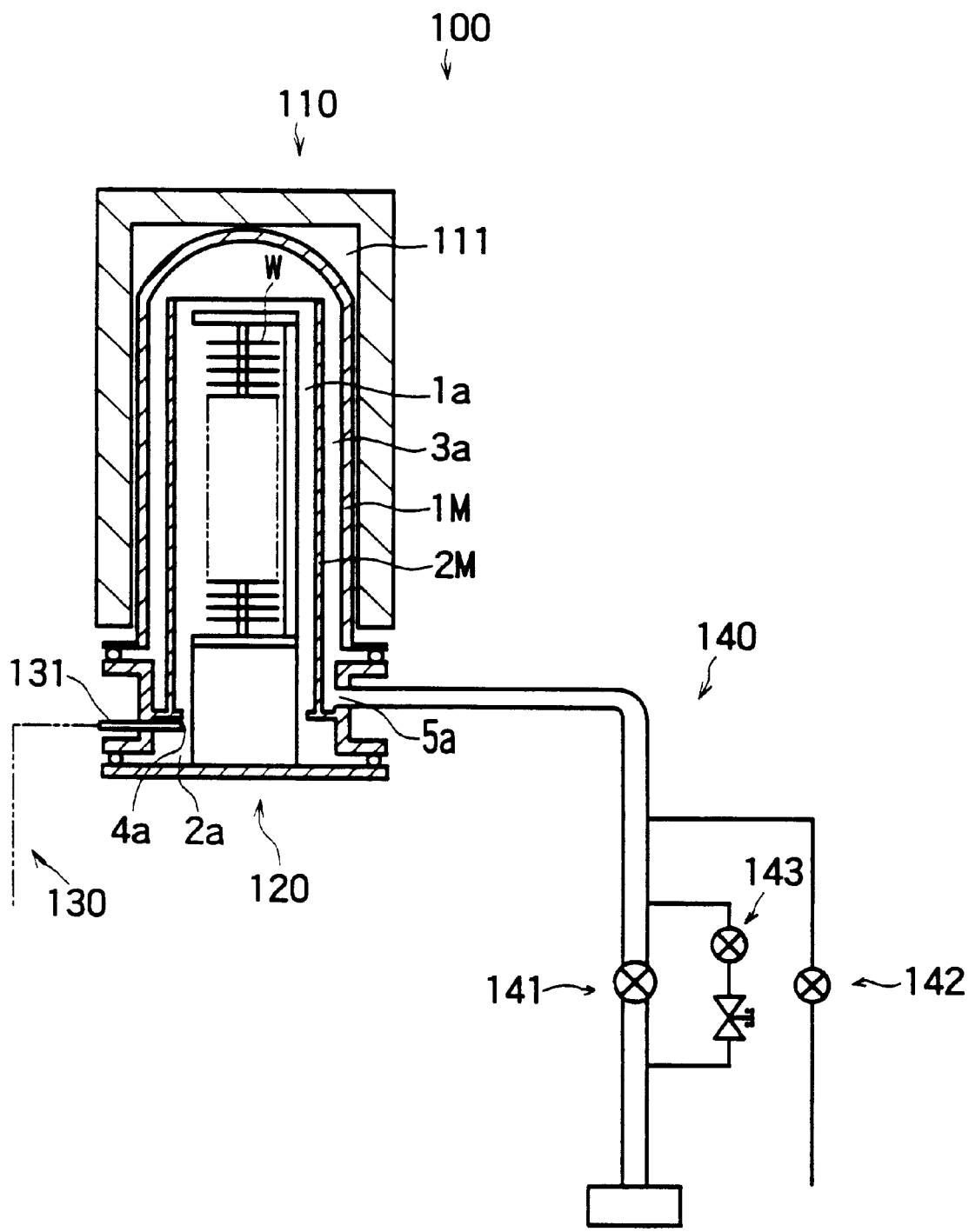
FIG. 13 is a sectional side diagram showing the configuration of the conventional substrate processing apparatus.

FIG. 12 is a perspective diagram showing the configuration of a further substrate processing apparatus which is a seventh embodiment of the present invention. Incidentally, in FIG. 12, like reference characters designate like portions having nearly same functions as of FIG. 1. Further, the descriptions of such portions are omitted herein.

In the foregoing description, there have been described the case that the present invention is applied to the substrate processing apparatus which has the reaction furnace 211 of double structure. In contrast, this seventh embodiment of the present invention can be applied to a substrate processing apparatus which has a reaction furnace 215 of single structure as illustrated in FIG. 12.

In this case, as illustrated in FIG. 12, the inert gas can be supplied to the inside of the reaction chamber 1a from a side opposite to the throat 2a by connecting the tip end portion 1C of the inert gas supply piping 276 with the top end portion of the reaction furnace 215, similarly as in the case of supplying the inert gas from the space 3a between the outer tube 1A and the inner tube 2A in the reaction furnace 211 of double structure. Thereby, the outside air can be restrained from intruding into the inside of the reaction chamber 1a.

8. Other Embodiments

In the foregoing description, seven embodiments of the present invention have been described. However, the present invention is not limited to the aforementioned embodiments.

(1) For example, in the case of the aforementioned first to seventh embodiments, the flow rate of the inert gas to be supplied to the reaction chamber 1a by the second gas supply system 240 is set in such a manner as to be larger than the flow rate of the atmosphere exhausted from the inside of the reaction chamber 1a by the second bypass line 264. However, in accordance with the present invention, the flow rate of the inert gas may be equal to or less than the flow rate of the atmosphere.

With such a configuration, the flow rate of the air drawn into the reaction chamber 1a from the throat 2a can be small in comparison with the case of only performing the exhausting of the atmosphere by using the second bypass line 264. Thus, the outside air can be restrained from entering the reaction chamber 1a through the throat 2a. As a result, the contamination of the inside of the reaction chamber 1a due to the intrusion of the outside air, the generation of particles, the generation of a haze, the growth of natural oxide film and so on can be suppressed.

Moreover, with such a configuration, in the case of setting the flow quantity of atmosphere exhausted by using the second bypass line 264, namely, in the case of setting the flow rate of the atmosphere, such setting can be achieved without considering the drawing of the air from the throat 2a. Thereby, the flow rate, by which the gas-phase backward flow can be effectively prevented, can be employed as the flow rate of the atmosphere.

(2) Further, in the case of the aforementioned first to seventh embodiments, the present invention is applied to the low pressure CVD apparatus. However, the present invention can be applied to an atmospheric pressure CVD apparatus.

(3) Moreover, in the case of the aforementioned first to seventh embodiments, the present invention is applied to CVD apparatus. However, the present invention can be applied to a thin film deposition apparatus other than CVD apparatus and to a substrate processing apparatus other than the thin film deposition apparatus.

(4) Furthermore, in the case of the aforesaid first to seventh embodiments, the present invention is applied to the substrate processing apparatus of processing wafers for a semiconductor device. However, the present invention can be applied to a substrate processing apparatus of processing substrates other than wafers. For the example, the present invention can be applied to a substrate processing apparatus of processing glass substrates for a liquid crystal display device.

(5) Additionally, in the foregoing description, the present invention is applied to the substrate processing apparatus other than those of the load-lock type. However, the present invention can be applied to a substrate processing apparatus of the load-lock type.

(6) Although the preferred embodiments of the present invention have been described above, it should be understood that the present invention is not limited thereto and that other modifications will be apparent to those skilled in the art without departing from the spirit of the invention.

The scope of the present invention, therefore, is to be determined solely by the appended claims.

What is claimed is:

1. A substrate processing apparatus for processing a substrate by utilizing a chemical reaction in a reaction enclosure, comprising:

a reaction enclosure including an outer tubular element and an inner tubular element substantially coaxially arranged in the reaction enclosure;

a first end portion of the reaction enclosure in which a substrate carrying-in/carrying-out opening is provided and through which a reaction gas for processing a substrate is supplied;

a second end portion of the reaction enclosure from which internal atmosphere is discharged to a space between the outer tubular element and the inner tubular element and the atmosphere is discharged through the space;

inert gas supply means for supplying an inert gas to the space between said outer tubular element and said inner tubular element in a selected term within a time period during which the inside of the reaction enclosure is opened to the outside through the substrate carrying-in/carrying-out opening; and atmosphere exhaust means including an atmosphere exhaust path for performing a substrate processing and for exhausting an atmosphere contained in the reaction enclosure by using the atmosphere exhaust path in the selected term within the time period during which the inside of said reaction enclosure is opened to the outside through the substrate carrying-in/carrying-out opening.

2. The substrate processing apparatus as set forth in claim 1, wherein the selected term is a term during which the substrate is carried into and carried out of said reaction enclosure through the substrate carrying-in/carrying-out opening.

3. The substrate processing apparatus as set forth in claim 2, wherein said inert gas supply means includes a gas supply opening disposed at a location where reaction by-products deposited on one or more inner walls of said reaction enclosure, which face the space between said outer tubular element and said inner tubular element and are in the vicinity of an atmosphere exhaust port for processing the substrate, are prevented from coming off and rising in the space.

4. The substrate processing apparatus as set forth in claim 2, further comprising heating means for heating the substrate carried into said reaction enclosure, and said inert gas supply means includes a gas supply opening disposed at a location heated by said heating means.

5. The substrate processing apparatus as set forth in claim 1, wherein said atmosphere exhaust means is exhausts the atmosphere contained in said reaction enclosure by performing a slow exhaust operation.

6. The substrate processing apparatus as set forth in claim 5, wherein said inert gas supply means includes a gas supply opening disposed at a location where reaction by-products deposited on one or more inner walls of said reaction enclosure, which face the space between said outer tubular element and said inner tubular element and are in the vicinity of an atmosphere exhaust port for processing the substrate, are prevented from coming off and rising in the space.

7. The substrate processing apparatus as set forth in claim 5, further comprising heating means for heating the substrate carried into said reaction enclosure, and said inert gas supply means includes a gas supply opening disposed at a location heated by said heating means.

8. The substrate processing apparatus as set forth in claim 1, wherein a flow rate of an inert gas supplied by said inert gas supply means is higher than a flow rate of the atmosphere exhausted by said atmosphere exhaust means.

9. The substrate processing apparatus as set forth in claim 8, wherein said inert gas supply means includes a gas supply opening disposed at a location where reaction by-products deposited on one or more inner walls of said reaction enclosure, which face the space between said outer tubular element and said inner tubular element and are in the vicinity of an atmosphere exhaust port for processing the substrate, are prevented from coming off and rising in the space.

10. The substrate processing apparatus as set forth in claim 8, further comprising heating means for heating the substrate carried into said reaction enclosure, and said inert gas supply means includes a gas supply opening disposed at a location heated by said heating means.

11. The substrate processing apparatus as set forth in claim 1, wherein said inert gas supply means includes a gas supply opening disposed at a location where reaction by-products deposited on one or more inner walls of said reaction enclosure, which face the space between said outer tubular element and said inner tubular element and are in the vicinity of an atmosphere exhaust port for processing the substrate, are prevented from coming off and rising in the space.

12. The substrate processing apparatus as set forth in claim 1, further comprising heating means for heating the substrate carried into said reaction enclosure, and said inert gas supply means includes a gas supply opening disposed at a location heated by said heating means.

13. The substrate processing apparatus as set forth in claim 1, wherein said inert gas supply means includes a plurality of gas supply openings.

14. The substrate processing apparatus as set forth in claim 13 wherein the plurality of gas supply openings are arranged along a periphery of said inner tubular element, and wherein the inert gas is supplied from each of the plurality of gas supply openings, in a direction toward said second end portion of said reaction enclosure.

15. The substrate processing apparatus as set forth in claim 1, wherein said inert gas supply means controls a flow rate of the inert gas supplied to the inside of said reaction enclosure, and said atmosphere exhaust means controls a flow rate of the atmosphere exhausted from the inside of said reaction enclosure.

16. The substrate processing apparatus as set forth in claim 15, wherein said atmosphere exhaust means includes:

exhaust means for exhausting the atmosphere contained in said reaction enclosure;

detection means for detecting a flow rate of the atmosphere to be exhausted by said exhaust means; and control means for controlling the flow rate of the atmosphere exhausted by the exhaust means so that the flow rate detected by said detection means has a selected value.

17. The substrate processing apparatus as set forth in claim 1, wherein said inner tubular element has an open upper end, and said inert gas supply means includes at least one gas supply opening disposed near to said open upper end.

18. The substrate processing apparatus as set forth in claim 17, wherein said inert gas supply means includes a plurality of gas supply openings disposed near to the open upper end of said inner tubular element.

19. The substrate processing apparatus as set forth in claim 1, wherein said reaction enclosure is arranged vertically, and said first end portion is set at a lower end portion of said reaction enclosure and said second end portion is set at an upper end portion of said reaction enclosure.

20. A method for processing a substrate by utilizing a chemical reaction in a reaction enclosure including an outer tubular element and an inner tubular element substantially coaxially arranged; a first end portion of the reaction enclosure in which a substrate carrying-in/carrying-out opening is provided and through which a reaction gas for processing a substrate is supplied; and a second end portion of the reaction enclosure from which internal atmosphere is discharged to a space between said outer tubular element and said inner tubular element and the atmosphere is discharged through the space, said method comprising:

supplying an inert gas to the space between said outer tubular element and said inner tubular element in a selected term within a time period during which an inside of said reaction enclosure is opened to the outside through the substrate carrying-in/carrying-out opening; and exhausting the atmosphere by using an atmosphere exhaust path for performing a substrate processing in the selected term within the time period during which the inside of said reaction enclosure is opened to the outside through the substrate carrying-in/carrying-out opening.

21. The substrate processing method as set forth in claim 20, wherein said inner tubular element has an open upper end, and the inert gas is supplied to the space between said outer tubular element and said inner tubular element through at least one gas supply opening disposed near to said open upper end.

22. The substrate processing method as set forth in claim 21, wherein said inert gas is supplied to the space between said outer tubular element and said inner tubular element through a plurality of gas supply openings disposed near to said open upper end of said inner tubular element.

23. A substrate processing apparatus for processing a substrate by utilizing a chemical reaction in a reaction enclosure that has a first end portion in which a substrate carrying-in/carrying-out opening is provided and a second end portion, said apparatus comprising:

heating means, surrounding said reaction enclosure, for heating a substrate carried into said reaction enclosure through said substrate carrying-in/carrying-out opening;

inert gas supply means for supplying an inert gas to an inside of said reaction enclosure from a part, which is placed at the second end portion of said reaction enclosure and is heated by the heating means, in a selected term within a time period during which the inside of said reaction enclosure is opened to the outside through the substrate carrying-in/carrying-out opening; and atmosphere exhaust means for exhausting an atmosphere contained in said reaction enclosure by vacuum pumping by performing a slow exhaust operation, and by using an atmosphere exhaust path for performing a substrate processing in the selected term within the time period during which the inside of said reaction enclosure is opened to the outside through said substrate carrying-in/carrying-out opening.

24. A substrate processing apparatus for processing a substrate by utilizing a chemical reaction in a reaction enclosure, comprising:

a reaction enclosure including an outer tubular element surrounding an inner tubular element so as to define a space between the outer tubular element and the inner tubular element;

a first end portion of the reaction enclosure including a substrate carrying-in/carrying-out opening and through which a reaction gas for processing a substrate is supplied;

a second end portion of the reaction enclosure from which internal atmosphere is discharged to the space between the outer tubular element and the inner tubular element and the atmosphere is discharged through the space;

an inert gas supply system that supplies an inert gas to the space between the outer tubular element and the inner tubular element in a selected term within a time period during which the inside of the reaction enclosure is opened to the outside through the substrate carrying-in/carrying-out opening, the inert gas supply system includes at least one gas supply opening disposed near to the second end portion of the reaction enclosure; and an atmosphere exhaust system including an atmosphere exhaust path for performing a substrate processing and that exhausts an atmosphere contained in the reaction enclosure by using the atmosphere exhaust path in the selected term within a time period during which the inside of the reaction enclosure is opened to the outside through the substrate carrying-in/carrying-out opening.

25. The substrate processing apparatus as set forth in claim 24, wherein the inert gas supply system includes a plurality of gas supply openings disposed near to the second end portion of the reaction enclosure.

26. A substrate processing apparatus for processing a substrate by utilizing a chemical reaction in a reaction enclosure that includes a first end portion in which a substrate carrying-in/carrying-out opening is provided and a second end portion, the reaction enclosure being arranged vertically, and the first end portion is set at a lower end portion of the reaction enclosure and the second end portion is set at an upper end portion of the reaction n enclosure, the apparatus comprising:

a heater surrounding the reaction enclosure, the heater heats a substrate carried into the reaction enclosure through the substrate carrying-in/carrying-out opening;

an inert gas supply system that supplies an inert gas to an inside of the reaction enclosure from a part, which is placed at the second end portion of the reaction enclosure and is heated by the heater, during a selected term within a time period during which the inside of the reaction enclosure is opened to the outside through the substrate carrying-in/carrying-out opening; and an atmosphere exhaust system that exhausts an atmosphere contained in the reaction enclosure by vacuum pumping by performing a slow exhaust operation, and by using an atmosphere exhaust path for performing a substrate processing during the selected term within the time period during which the inside of the reaction enclosure is opened to the outside through the substrate carrying-in/carrying-out opening.

\* \* \* \* \*

UNITED STATES PATENT AND TRADEMARK OFFICE
CERTIFICATE OF CORRECTION

PATENT NO. : 6,139,642
DATED : October 31, 2000
INVENTOR(S) : Takashi SHIMAHARA, Naoto NAKAMURA, Ichiro SAKAMOTO and Kiyohiko MAEDA It is certified that error appears in the above-identified patent and that said Letters Patent is hereby corrected as shown below:

Please correct claim 26 as follows:

Claim 26, line 8, change "reaction n" to --reaction--.

Signed and Sealed this

First Day of May, 2001

Attest:

NICHOLAS P. GODICI

*Attesting Officer*   *Acting Director of the United States Patent and Trademark Office*